US010711193B2

(12) United States Patent
Kim et al.

(10) Patent No.: US 10,711,193 B2
(45) Date of Patent: Jul. 14, 2020

(54) QUANTUM DOTS AND PRODUCTION METHODS THEREOF, AND QUANTUM DOT POLYMER COMPOSITES AND ELECTRONIC DEVICES INCLUDING THE SAME

(71) Applicant: SAMSUNG ELECTRONICS CO., LTD., Suwon-si, Gyeonggi-do (KR)

(72) Inventors: Yongwook Kim, Yongin-si (KR); Sungwoo Hwang, Suwon-si (KR); Soo Kyung Kwon, Suwon-si (KR); Yuho Won, Seoul (KR); Eun Joo Jang, Suwon-si (KR); Hyo Sook Jang, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/205,323

(22) Filed: Nov. 30, 2018

(65) Prior Publication Data
US 2019/0169500 A1   Jun. 6, 2019

(30) Foreign Application Priority Data
Dec. 1, 2017   (KR) .................. 10-2017-0164495

(51) Int. Cl.
*C09K 11/88*   (2006.01)
*C09K 11/02*   (2006.01)
(Continued)

(52) U.S. Cl.
CPC .......... *C09K 11/883* (2013.01); *C09K 11/025* (2013.01); *H01L 27/322* (2013.01);
(Continued)

(58) Field of Classification Search
CPC ... C09K 11/883; C09K 11/025; H01L 27/322; H01L 51/502; G02F 1/133; B82Y 20/00; B82Y 40/00
See application file for complete search history.

(56) References Cited

U.S. PATENT DOCUMENTS 9,260,652 B2    2/2016  Peng et al.
2012/0175588 A1*  7/2012  Qiao ................. C09K 11/883
                                                              257/13
(Continued)

FOREIGN PATENT DOCUMENTS

WO    2017019789 A1    2/2017

OTHER PUBLICATIONS

Ning et al. ("Graded Doping for Enhanced Colloidal Quantum Dot Photovoltaics," Advanced Materials, 25, pp. 1719-1723, 2013) (Year: 2013).*

(Continued)

*Primary Examiner* — Yasser A Abdelaziez
(74) *Attorney, Agent, or Firm* — Cantor Colburn LLP

(57) ABSTRACT

A quantum dot, a method of producing the same, a quantum dot polymer composite including the same, and an electronic device. The quantum dot includes a core including a first semiconductor nanocrystal and a shell disposed on the core, the shell including a second semiconductor nanocrystal and a metal dopant, wherein the first semiconductor nanocrystal includes a Group II-VI compound, a Group III-V compound, or a combination thereof, the second semiconductor nanocrystal includes a Group II-VI compound, and the metal dopant includes hafnium, zirconium, titanium, or a combination thereof.

28 Claims, 8 Drawing Sheets

(51) Int. Cl.
*H01L 51/50* (2006.01)
*H01L 27/32* (2006.01)
*B82Y 40/00* (2011.01)
*B82Y 20/00* (2011.01)
*G02F 1/133* (2006.01)

(52) U.S. Cl.
CPC ............ *H01L 51/502* (2013.01); *B82Y 20/00* (2013.01); *B82Y 40/00* (2013.01); *G02F 1/133* (2013.01)

(56) References Cited

U.S. PATENT DOCUMENTS

| | | | |
|---|---|---|---|
| 2016/0093776 A1 | 3/2016 | Setlur et al. | |
| 2017/0183565 A1* | 6/2017 | Jun | C09K 11/025 |
| 2017/0247614 A1* | 8/2017 | Li | C09K 11/883 |
| 2018/0231843 A1* | 8/2018 | Park | G02F 1/133617 |
| 2019/0119569 A1* | 4/2019 | Lee | C09K 11/883 |

OTHER PUBLICATIONS

Tonino Greco et al., "InP/ZnSe/ZnS core-multishell quantum dots for improved luminescence efficiency", SPIE Photonics Europe 2012, May 1, 2012, pp. 1-9, vol. 8424.

Ung Thi Dieu Thuy et al., "Europium doped In(Zn)P/ZnS colloidal quantum dots", Dalton Transactions, Apr. 4, 2013, pp. 12606-12610, vol. 42.

\* cited by examiner

Pattern Preparation by using a photoresist

Repeating the Patterning Process three times

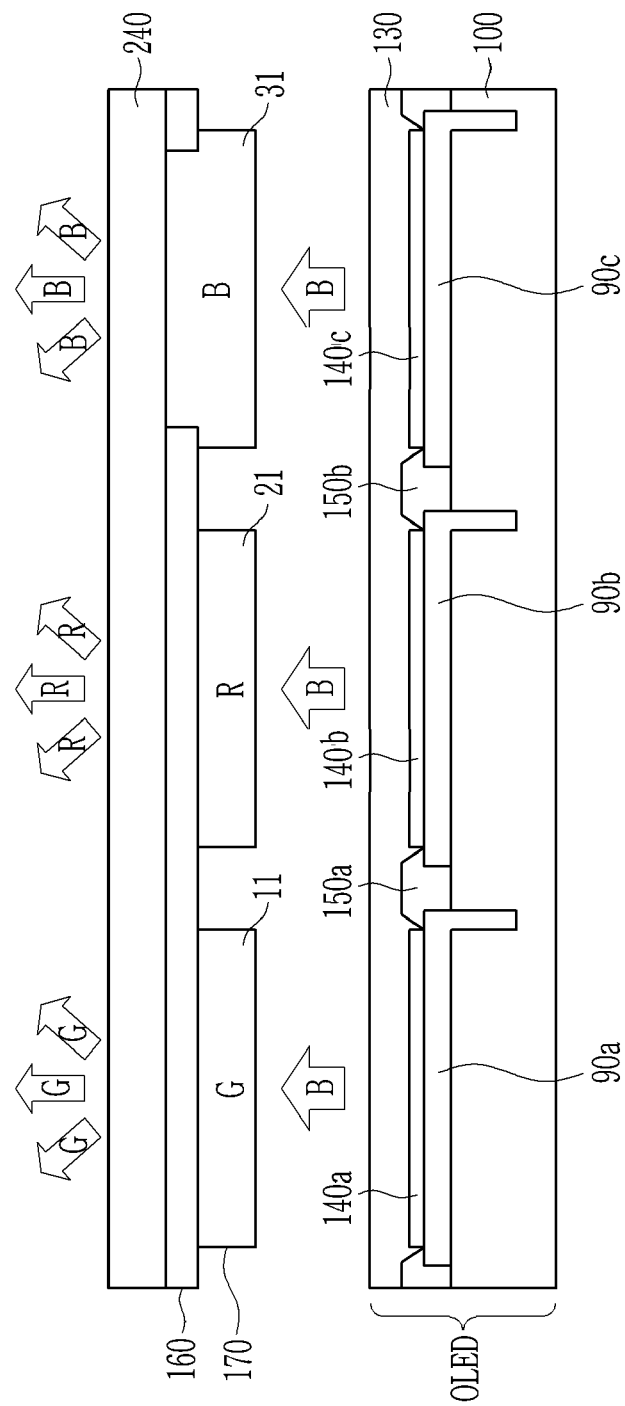

QUANTUM DOTS AND PRODUCTION METHODS THEREOF, AND QUANTUM DOT POLYMER COMPOSITES AND ELECTRONIC DEVICES INCLUDING THE SAME

CROSS-REFERENCE TO RELATED APPLICATION

This application claims priority to and the benefit of Korean Patent Application No. 10-2017-0164495 filed in the Korean Intellectual Property Office on Dec. 1, 2017, and all the benefits accruing therefrom under 35 U.S.C. § 119, the entire content of which is incorporated herein by reference.

BACKGROUND

1. Field

Quantum dots, production methods thereof, and quantum dot-polymer composites and electronic devices including the same are disclosed.

2. Description of the Related Art

Physical characteristics (e.g., energy bandgaps, etc.) of nanoparticles that are intrinsic characteristics may be controlled by changing the particle sizes of nanoparticles, unlike bulk materials. For example, semiconductor nanocrystals also known as quantum dots are a semiconductor material having a nano-scale sized crystal structure.

Quantum dots have a large surface area per unit volume and exhibit quantum confinement effects, and thus have different physicochemical characteristics from the characteristics of a bulk material having the same composition.

Quantum dots may be applied to, e.g., used or included in, various electronic devices such as display devices and thus desired is a technique capable of providing quantum dots having improved properties.

SUMMARY

An embodiment provides a quantum dot (e.g., environmentally-friendly quantum dot) having improved photoluminescence characteristics and stability (e.g., thermal stability).

An embodiment provides a method of producing the quantum dot.

An embodiment provides a quantum dot polymer composite including the quantum dot.

An embodiment provides an electronic device including the quantum dot.

In an embodiment, a quantum dot includes a core including a first semiconductor nanocrystal and a shell disposed on the core, the shell including a second semiconductor nanocrystal and a metal dopant, wherein the first semiconductor nanocrystal includes a Group II-VI compound, a Group III-V compound, or a combination thereof, the second semiconductor nanocrystal includes a Group II-VI compound, and the metal dopant includes hafnium, zirconium, titanium, or a combination thereof.

The first semiconductor nanocrystal may include a Group III-V compound.

The Group III-V compound may include InP, InZnP, InAs, InSb, or a combination thereof.

The core may not include Ti, Zr, Hf, V, Nb, Ta, Cr, Mo, W, Mn, Tc, Re, Fe, Ru, Os, Co, Rh, Ir, Ni, Pd, Pt, Cu, Ag, Au, Li, Na, K, Rb, Cs, Fr, or a combination thereof.

The shell may not include a trivalent cation of a Group IIIA element.

The second semiconductor nanocrystal may include zinc (Zn), sulfur (S), selenium (Se), and optionally tellurium.

The shell may include a non-metal dopant.

The non-metal dopant may include fluorine.

The shell may not include phosphorus (P).

The shell may have a varying composition in a radial direction.

The shell may include sulfur. An amount of the sulfur may increase in a radial direction toward the surface of the quantum dot.

The shell may include at least two layers and adjacent layers may include semiconductor nanocrystals having different compositions.

The outermost layer of the shell may include ZnS.

The outermost layer of the shell may include the metal dopant.

An amount of the metal dopant may be greater than or equal to about 0.001 moles, based on 1 mole of a base metal of the first semiconductor nanocrystal.

An amount of the metal dopant may be less about than 0.1 weight percent (wt %), based on a total atomic weight of the quantum dot.

The quantum dot may have a full width at half maximum (FWHM) of less than or equal to about 40 nanometers (nm).

The quantum dot may have a quantum yield of greater than or equal to about 72%.

In an embodiment, a method of producing the quantum dot of the aforementioned embodiments includes:

preparing a mixture including a particle including the core including the first semiconductor nanocrystal, a shell metal precursor, a shell non-metal precursor, an organic ligand, a solvent, and a dopant precursor, and heating the mixture to a reaction temperature to form the shell including the metal dopant and the second semiconductor nanocrystal on the particle to produce the quantum dot, wherein the dopant precursor includes hafnium, zirconium, titanium, or a combination thereof.

The preparing of the mixture may include forming a shell layer directly on the core, the shell layer having a different composition from the second semiconductor nanocrystal, the shell layer including a third semiconductor nanocrystal that does not include the metal dopant.

The dopant precursor may include an oleate, a stearate, a chloride, an octanoate, an acetate, an alkoxide, a palmitate, an isopropoxide, a propoxide, or a combination thereof.

An embodiment provides an electronic device including the quantum dot. The electronic device may be a light emitting diode (LED), a sensor, an imaging sensor, a solar cell, or a liquid crystal display (LCD) device.

In an embodiment, a quantum dot-polymer composite includes a polymer matrix; and a plurality of quantum dots dispersed in the polymer matrix, wherein the plurality of quantum dots includes the quantum dot.

The polymer matrix may include a cross-linked polymer, a carboxylic acid-containing binder polymer, or a combination thereof.

The cross-linked polymer may include a thiolene resin, a cross-linked poly(meth)acrylate, a cross-linked polyurethane, a cross-linked epoxy resin, a cross-linked vinyl polymer, a cross-linked silicone resin, or a combination thereof.

In an embodiment, a photoluminescence display device includes the quantum dot polymer composite.

The display device may further include a light source to supply incident light to the quantum dot polymer composite.

The photoluminescence display device may include a patterned layer on a substrate, the patterned layer including a first section configured to emit a first light and a second section configured to emit a second light having a different wavelength from the first light, wherein at least one of the first section and the second section may include the quantum dot-polymer composite.

In an embodiment, an electroluminescent device includes
a first electrode and a second electrode facing each other; and
a quantum dot emission layer disposed between the first electrode and the second electrode, the quantum dot emission layer including a plurality of quantum dots, wherein the plurality of quantum dots include the quantum dot of the aforementioned embodiments.

The quantum dot according to an embodiment may exhibit improved properties (e.g., photoluminescence characteristics and thermal stability) due to, for example, the doping of the shell by a Group IV metal element and may contribute to efficiency improvement of an electronic device (e.g., display device). The polymer composite including the quantum dot according to an embodiment is provided in a suitable form (e.g., a sheet, a rod, and the like), may be utilized as a color conversion element of an electronic device (e.g., display device) such as a television (TV)/monitor/mobile phone, and may improve color reproducibility and luminance of a display device. The quantum dot may be a biomolecular fluorescent label and may improve detection sensitivity of bioimages, in vitro diagnostics, and the like.

BRIEF DESCRIPTION OF THE DRAWINGS

FIG. 3A to 3C are a schematic view showing a cross-section of a photoluminescence device according to an embodiment.

DETAILED DESCRIPTION

Figure 1:
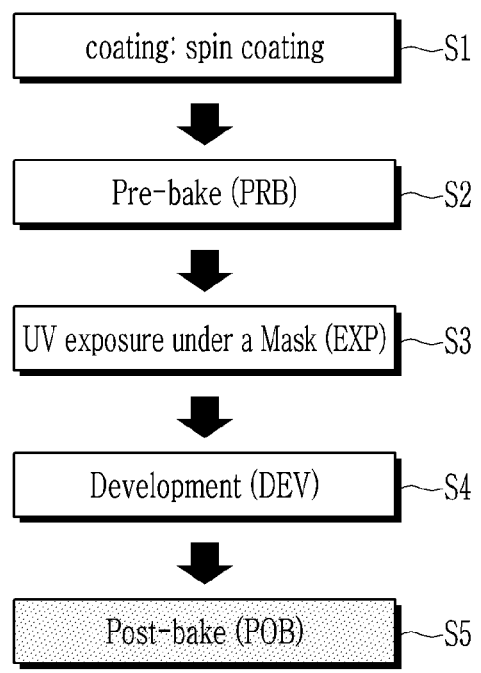
FIG. 1 shows an exemplary process of producing a patterned quantum dot polymer composite layer.
Figure 1:
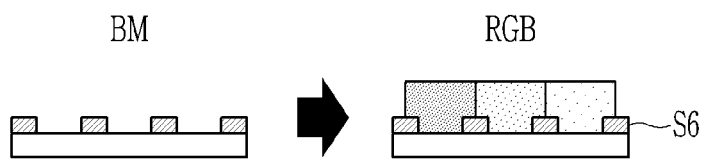

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" and "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" other elements would then be oriented "above" the other elements. The exemplary term "below" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to a compound, a group, or a moiety wherein at least one of hydrogen atoms thereof is replaced by a substituent of a C1 to C30 alkyl group, a C1 to C30 alkenyl group, a C2 to C30 alkynyl group, a C2 to C30 epoxy group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), sulfonic acid group (—SO$_3$H) or a salt thereof (—SO$_3$M, wherein M is an organic or inorganic cation), phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hetero" may refer to inclusion of 1 to 3 heteroatoms of, N, O, S, Si, or P.

As used herein, "alkylene group" may refer to a straight or branched saturated aliphatic hydrocarbon group having a valence of at least two, optionally substituted with at least one. As used herein, "arylene group" may refer to a group having a valence of at least two obtained by removal of at least two hydrogens in at least one aromatic ring, optionally substituted with at least one substituents.

As used herein, "aliphatic hydrocarbon group" may refer to a C1 to C30 straight or branched hydrocarbon group (e.g., C1 to C30 alkyl, C2 to C30 alkenyl, C2 to C30 alkynyl), the term "aromatic hydrocarbon group" may refer to C6 to C30 aryl group or C2 to C30 heteroaryl group, and the term "alicyclic hydrocarbon group" may refer to a C3 to C30 cycloalkyl group, a C3 to C30 cycloalkenyl group, and a C3 to C30 cycloalkynyl group.

As used herein, "(meth)acrylate" may refer to acrylate and/or methacrylate. The (meth)acrylate can be a (C1 to C10 alkyl)acrylate or a (C1 to C10 alkyl)methacrylate.

As used herein, "dispersion" may refer to dispersion wherein a dispersed phase is a solid and a continuous phase includes a liquid. The "dispersion" may refer to a colloidal dispersion wherein the dispersed phase has a dimension of greater than or equal to about 1 nm and less than or equal to several micrometers (μm) (e.g., several micrometers or less, about 3 μm or less, about 2 μm or less, or about 1 μm or less).

As used herein, the term "group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si. As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, "doping" may refer to inclusion of a dopant (e.g., as an element in a lattice or between the lattices such as an interstitial atom) without bring forth a substantial change of an original crystal structure. For example, the dopant (e.g., a metal dopant) may be substituted for a portion of the corresponded crystal structure or exist as an interstitial atom between the crystal lattices. An X-ray diffraction (XRD) spectrum of a doped product may not show a change due to, for example, a dopant. The dopant may not exhibit a substantial crystalline peak in an X-ray diffraction spectrum. The presence (or amount) of the dopant element may be confirmed by an X-ray photoelectron spectroscopy, a dispersive X-ray spectroscopy), inductively coupled atom light emitting spectroscopy (ICP-AES), or time-of-flight secondary ion mass spectrometry (TOF-SIMS).

As used herein, the term "hydrophobic moiety" may refer to a moiety providing the corresponding compound with a tendency to be agglomerated in an aqueous solution and to repel water. For example, the hydrophobic moiety may include a C1+(e.g., C2+, C3+, C4+, C5+, or C6+) aliphatic hydrocarbon group (alkyl, alkenyl, alkynyl, etc.), a C6+ aromatic hydrocarbon group (phenyl, naphthyl, aralkyl group, etc.), or a C5+ alicyclic hydrocarbon group (cyclohexyl, norbornenyl, etc.). In some cases, the hydrophobic moiety may not mixed with the ambient medium since it is substantially lacking capability of making a hydrogen bond with the ambient medium, or since the polarity thereof is not matched with that of the ambient medium.

A quantum dot according to an embodiment includes a core including a first semiconductor nanocrystal and a shell disposed on the core. The shell includes a second semiconductor nanocrystal and a metal dopant. The first semiconductor nanocrystal includes a Group II-VI compound, a Group III-V compound, or a combination thereof. The first semiconductor nanocrystal may include a Group III-V compound. The second semiconductor nanocrystal includes a Group II-VI compound. The metal dopant includes hafnium, zirconium, titanium, or a combination thereof. In an embodiment, the quantum dot may not include a heavy metal such as cadmium, lead, and/or mercury.

The Group II-VI compound may be a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, HgZnS, HgZnSe, HgZnTe, MgZnSe, MgZnS, CdZnS, CdZnSe, CdZnTe, CdHgS, CdHgSe, CdHgTe, or a combination thereof; or a quaternary element compound of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto.

The Group III-V compound may be a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. For example, the Group III-V compound may further include a Group II metal (e.g., InZnP).

The core may not include a (core) metal dopant of, e.g., the core may not include, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Li, Na, K, Rb, Cs, Fr, or a combination thereof. The core metal dopant may function as a center of photoluminescence. The quantum dot according to an embodiment may not include the core metal dopant, and thus a photoluminescence spectrum of the quantum dot according to an embodiment may not exhibit a photoluminescence peak related to the core metal dopant (e.g., in case of the doping of copper, a Cu-related photoluminescence) or a shift of a center wavelength.

The second semiconductor nanocrystal included in the shell may have a different composition from the first semiconductor nanocrystal. The second semiconductor nanocrystal may have a larger bandgap than that of the first semiconductor nanocrystal. The shell may not include a trivalent cation of a Group IIIA element. The shell may not include indium. The shell may not include gallium. The shell may not include aluminum. When the metal dopant (e.g., hafnium, zirconium, titanium, or a combination thereof) and the trivalent cation of a Group IIIA compound are included in the shell, luminous efficiency (QY) of the quantum dot may be decreased.

The second semiconductor nanocrystal may include zinc (Zn), sulfur (S), selenium (Se), and optionally tellurium. The second semiconductor nanocrystal may include a different metal from the first semiconductor nanocrystal. In an embodiment, the second semiconductor nanocrystal may include ZnSe, ZnS, ZnSeS, ZnSeTe, ZnSTe, ZnSeSTe, or a combination thereof.

The shell may have a composition changing, e.g., a varying composition, in a radial direction. The interface (or the interfacial layer) between the core and the shell may have a concentration gradient in which a concentration of an element (e.g., sulfur and/or selenium) in the shell changes in a radial direction. The changes in the composition of the quantum dot may be confirmed by an element mapping using, for example, energy dispersive spectroscopy. The shell may include sulfur. An amount of the sulfur may be increased, e.g., may increase, in a radial direction toward the surface of the quantum dot. The layer of the shell may have a single composition or an alloy layer. The alloy layer may have a uniform alloy or a gradient alloy, e.g., an alloy including a gradient.

The shell may be a multi-layered shell having at least two layers. In the multi-layered shell, adjacent layers may include semiconductor nanocrystals having different compositions. In the multi-layered shell, an energy bandgap of an outside layer (e.g., second layer) may be larger than an energy bandgap of the layer adjacent to the core (e.g., first layer). In the multi-layered shell, the energy bandgap of the outside layer may be smaller than the energy bandgap of the layer adjacent to the core. The outside layer may be an outermost layer. The outermost layer of the shell may include an excess amount of ZnS or ZnSeS (excess amount of S). In the shell, a first layer disposed directly on the core may include ZnSe or ZnSeS (excess amount of Se). In the multi-layered shell, the metal dopant may be doped to a suitable layer (e.g., inside layer or outside layer). In an embodiment, the outermost layer of the shell may include the metal dopant.

The shell of the quantum is doped by a metal dopant. The metal dopant includes hafnium, zirconium, titanium, or a combination thereof. The shell may include a non-metal dopant. The non-metal dopant may include fluorine. The shell may not include phosphorus (P).

An amount of the metal dopant included in the shell of the quantum dot may be greater than or equal to about 0.001 moles, for example, greater than or equal to about 0.005 moles, greater than or equal to about 0.01 moles, greater than or equal to about 0.02 moles, or greater than or equal to about 0.03 mol, based on 1 mole of a base metal of the first semiconductor nanocrystal. Herein, the base metal refers to a main metal constituting a compound that constitutes a given semiconductor nanocrystal. For example, if the semiconductor nanocrystal includes (e.g., is based on) a Group III-V compound (e.g., InP core), the base metal refers to a Group III metal (e.g., indium). An amount of the metal dopant may be less than about 0.1 wt %, based on a total atomic weight of the quantum dot.

The presence of the dopant in the quantum dot may be confirmed by an X-ray photoelectron spectroscopy (XPS), an inductively coupled atom light emitting spectroscopy (ICP-AES), or a time-of-flight secondary ion mass spectrometry (TOF-SIMS), but is not limited thereto. For example, an amount of the dopant in the quantum dot may be confirmed by an XPS analysis or an ICP-AES analysis, but is not limited thereto.

The quantum dot may absorb light from an excitation source to be excited, and may emit energy (e.g., light) corresponding to the energy bandgap of the quantum dot. The energy bandgap of the quantum dot may be controlled by adjusting sizes and compositions of nanocrystals and thus realize a relatively high color purity.

The surface of the core quantum dot may be coated with an inorganic shell in order to utilize optical properties of the quantum dot in various environments. For example, a core consisting of a Group III-V or Group II-V compound semiconductor may be coated with a compound semiconductor (shell) having a wide (or narrow) bandgap. Such a quantum dot having a core-shell structure may have slightly improved luminous efficiency due to, for example, surface passivation of the shell. Applicable quantum dots may have a core including cadmium. Because cadmium is an environmentally hazardous component, desired is a cadmium free quantum dot having improved photoluminescence properties. Various defects occurring during a shell formation may have an adverse effect on photoluminescence properties of a core-shell type quantum dot.

For example, an indium-based core (e.g., InP core), which is an environmentally-friendly non-toxic quantum dot, may have a shell of a different composition (e.g., ZnSe and ZnS). A uniform coating of the shell on the core may contribute to quantum efficiency. However, the oxidation number and the crystal constants of the elements constituting the core and the shell may be different, and thus uniform coating may not be easy to accomplish. Improvement of a luminous efficiency of a quantum dot may contribute to improvement of luminescence of an electronic device (e.g., display device) and power efficiency.

When a shell of ZnSe, ZnSeS, ZnS, or the like is coated on an indium based (InP) core, a relatively thin shell may grow along a lattice of a nucleus quantum dot, but as a thickness of the shell increases, the shell may grow along an intrinsic lattice thereof, and thereby a lattice defect and/or lattice knot may occur, causing a decrease in a luminous efficiency of a quantum dot as prepared. A quantum dot having a relatively thin shell may have a poor stability (e.g., thermal stability), which may limit various applications of the quantum dot. The quantum dot according to an embodiment may exhibit improved luminous efficiency, improved thermal stability, and improved stability against external environments due to, for example, the shell being doped with the metal dopant.

The quantum dot according to an embodiment may have quantum efficiency of greater than or equal to about 70%, for example, greater than or equal to about 75%, greater than or equal to about 80%, greater than or equal to about 90%, or 100%. The quantum dot may have a relatively narrow spectrum so as improve color purity or color reproducibility. The quantum dot may have for example a full width at half maximum (FWHM) of a photoluminescence wavelength spectrum of less than or equal to about 40 nm, less than or equal to about 35 nm, or less than or equal to or about 30 nm.

Absorption/photoluminescence wavelength of the quantum dot may be controlled by controlling a composition and/or a size (or size of the core) (that will be described later). The photoluminescence (PL) peak wavelength (hereinafter, also referred to as a luminous peak wavelength) of the quantum dot may be greater than or equal to about 450 nm and less than or equal to about 700 nm. In an embodiment, the luminous peak wavelength may be greater than or equal to about 500 nm, for example, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The luminous peak wavelength may be for example less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The luminous peak wavelength of the quantum dot may be about 500 nm to about 650 nm. When the quantum dot emits green light, the photoluminescence peak wavelength may be about 500 nm to about 540 nm, but is not limited thereto. When the quantum dot emits red light, the luminous peak wavelength may be about 610 nm to about 640 nm, but is not limited thereto.

The quantum dot may have a particle size of greater than or equal to about 1 nm and less than or equal to about 100 nm (e.g., a diameter or in case of a non-spherical shape, the largest linear length crossing the particle or a diameter calculated from a two-dimensional area confirmed by a transmission electron microscope). In an embodiment, the quantum dot may be greater than or equal to about 2 nm, greater than or equal to about 3 nm, greater than or equal to about 4 nm, or greater than or equal to about 5 nm. The quantum dot may be less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, or less than or equal to about 7 nm. A shape of the quantum dot is not particularly limited. For example, the shape of the quantum dot may be a spherical shape, oval, pyramidal, multi-arm, or cubic nanoparticle, nanotube, nanowire, nanofiber, nanosheet, or a combination thereof.

The quantum dot may include an organic ligand. The organic ligand (or suitable organic solvent during a colloid synthesis) may be bound to a surface of the quantum dot. The organic ligand may include $RCOOH$, $RNH_2$, $R_2NH$, $R_3N$, $RSH$, $R_3PO$, $R_3P$, $ROH$, $RCOOR'$, $RPO(OH)_2$, $RHPOOH$, $R_2POOH$ (wherein, R and R' are independently a C5 to C40 substituted or unsubstituted aliphatic hydrocarbon group such as a C3 to C24 alkyl or alkenyl group or a C6 to C40 substituted or unsubstituted aromatic hydrocarbon group such as a C6 to C20 aryl group), a polymer organic ligand, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compounds such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; an oxide of a phosphine compound such methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, or trioctyl phosphine oxide; a diphenyl or triphenyl phosphine compound, or an oxide compound thereof; a C5 to C20 alkyl phosphonic acid such as hexyl phosphinic acid, octyl phosphinic acid, dodecane phosphinic acid, tetradecane phosphinic acid, hexadecane phosphinic acid, octadecane phosphinic acid; and the like, but are not limited thereto. The quantum dot may include one or more hydrophobic organic ligands that can be the same or different. The organic ligand may not include a photopolymerizable moiety (e.g., acrylate group, methacrylate group, etc.).

Examples of a suitable organic solvent for use in the colloid synthesis may be a C6 to C22 primary amine such as hexadecylamine; a C6 to C22 secondary amine such as dioctylamine; a C6 to C40 tertiary amine such as a trioctyl amine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as a phenyl ether or a benzyl ether, or a combination thereof, but are not limited thereto.

In an embodiment, a method of producing the quantum dot of the aforementioned embodiments includes preparing a mixture including a particle including the core including the first semiconductor nanocrystal, a shell metal precursor (e.g., including Group 2B metal), (e.g., at least one type of) a shell non-metal precursor, an organic ligand, a solvent, and a dopant precursor; and heating the mixture to a reaction temperature to form a shell including a dopant and the second semiconductor nanocrystal on the particle, wherein the dopant precursor includes hafnium, zirconium, titanium, or a combination thereof.

The preparing of the mixture may include forming a shell layer (e.g., first layer) having a different composition from the second semiconductor nanocrystal and including a third semiconductor nanocrystal that does not include the dopant, directly on the core. The third semiconductor nanocrystal may include ZnSe, ZnSeS (excess amount of Se), or a combination thereof. The mixture may further include a precursor for a non-metal dopant (e.g., hydrofluoric acid or ionic liquid).

The first semiconductor nanocrystal, the second semiconductor nanocrystal, the metal dopant, the organic ligand, and the organic solvent are the same as described above. The first semiconductor nanocrystal may be produced by a suitable method, but is not particularly limited.

Types and amounts of the shell metal precursor may not be particularly limited and may be desirably selected considering a composition of the second semiconductor nanocrystal. For example, the shell metal precursor may include a Group IIB metal. The shell metal precursor may be a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, or a metal peroxide. For example, when the second semiconductor nanocrystal includes zinc, the shell metal precursor may include a Zn metal powder, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, a Zn oxide, or a Zn peroxide. When the second semiconductor nanocrystal includes zinc, examples of the shell metal precursor may include dimethyl zinc, diethyl zinc, a zinc acetate, a zinc acetylacetonate, a zinc iodide, a zinc bromide, a zinc chloride, a zinc fluoride, a zinc carbonate, a zinc cyanide, a zinc nitrate, a zinc oxide, a zinc peroxide, a zinc perchlorate, and a zinc sulfate, but are not limited. One or more shell metal precursors, e.g., two or more different shell metal precursors, may be used (e.g., according to a composition of the second semiconductor nanocrystal).

Types and amounts of the shell non-metal precursor may be desirably selected, and may not be particularly limited. Examples of the shell non-metal precursor may be hexane thiol, octane thiol, decane thiol, dodecane thiol, hexadecane thiol, mercaptopropyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, an ammonium sulfide, a sodium sulfide, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), and the like, but are not limited thereto.

The dopant precursor may include an oleate, a stearate, a chloride, an octanoate, an acetate, an alkoxide, a palmitate, an isopropoxide, a propoxide, or a combination thereof. For example, examples of the dopant precursor may include a hafnium isopropoxide, a zirconium isopropoxide, a titanium isopropoxide, and a zirconium propoxide ($Zn(OPr)_4$), but are not limited thereto.

In the mixture, an amount of each component (e.g., the shell metal precursor or the shell non-metal precursor) may be desirably controlled (e.g., considering a thickness of a desirable shell, a shell composition, kinds of the precursors, etc.), but is not particularly limited. An amount of the dopant precursor may be desirably controlled according to kinds of the dopant or desirable doping amounts, but is not particularly limited. An amount of the dopant precursor may be about 0.001 moles to about 0.5 moles per 1 mole of the shell metal precursor, but is not particularly limited.

The shell composition of the obtained quantum dots may be controlled by adjusting the adding time and the adding amount of precursors and the temperature of the reaction mixture. For example, each of the shell metal precursor, the shell non-metal precursor, and the dopant precursor may independently be two or more kinds. When using at least two kinds of precursors, each precursor may be added to the (optionally heated) reaction mixture (at the same or different temperature), simultaneously or leaving a predetermined time lag. For example, each precursor may be mixed with the same/different type of ligand and/or solvent (e.g., organic solvent), considering the shell composition of the final quantum dot, and then added into the reaction system once or through more times.

The mixture is heated at a reaction temperature to perform a reaction between shell metal precursors, (e.g., one or more kinds of) shell non-metal precursors, so that a shell layer including the second semiconductor nanocrystal on the core particle, and simultaneously a dopant may be introduced into the crystal of the second semiconductor (e.g., doped into the second semiconductor nanocrystal).

The reaction temperature is not particularly limited but may be desirably selected considering the type of the shell metal precursor, the shell non-metal precursor, the dopant precursor, and used solvent/organic ligand. For example, the reaction temperature may be greater than or equal to about 100° C., for example, greater than or equal to about 120° C., greater than or equal to about 150° C., greater than or equal to about 170° C., greater than or equal to about 200° C., greater than or equal to about 210° C., greater than or equal to about 220° C., greater than or equal to about 230° C., greater than or equal to about 240° C., greater than or equal to about 250° C., or greater than or equal to about 260° C. For example, the reaction temperature may be less than or equal to about 350° C., for example less than or equal to about 340° C., less than or equal to about 330° C. For example, the reaction temperature may be about 220° C. to about 340° C.

The reaction time is not particularly limited, but may be desirably selected. For example, the reaction may be performed for greater than or equal to about 1 second, for example, greater than or equal to about 1 minute, greater than or equal to about 5 minutes, greater than or equal to about 10 minutes, greater than or equal to about 15 minutes, greater than or equal to about 20 minutes, or greater than or equal to about 25 minutes, but is not limited thereto. When the precursor mixture is added in a stepwise, the reaction may be performed at each step for a predetermined time (e.g., greater than or equal to about 5 minutes, greater than or equal to about 10 minutes, or greater than or equal to 15 minutes). The reaction may be performed under the inert gas atmosphere or under air or vacuum, but is not limited thereto. The shell (metal/non-metal) precursors and dopant precursor may be further added once or more (e.g., twice, three times, four times, or more).

The mixture may further include ionic liquid or hydrofluoric acid. The ionic liquid or hydrofluoric acid may be added along with the shell precursors and/or the dopant precursor or separately. The ionic liquid is a liquid-state salt and is composed of an ion and a counter ion. In an embodiment, the ionic liquid may include a substituted or unsubstituted imidazolium salt, a substituted or unsubstituted pyrazolium salt, a substituted or unsubstituted triazolium salt, a substituted or unsubstituted thiazolium salt, a substituted or unsubstituted oxazolium salt, a substituted or unsubstituted pyridizinium salt, a substituted or unsubstituted pyrimidinium salt, a substituted or unsubstituted ammonium salt, a substituted or unsubstituted phosphonium salt, a substituted or unsubstituted sulfonium salt, a substituted or unsubstituted pyridinium salt, a substituted or unsubstituted pyrrolidinium salt. The ionic liquid may include an anion of a halide anion such as $F^-$, a tetrafluoroborate anion ($BF_4^-$), a hexafluorophosphate anion ($PF_6^-$), $ClO_4^-$, an acetate anion, a trifluoroacetate anion, a triflate anion, a hydrogen sulfate anion, an alkylsulfate anion, a sulfite anion, a hydrogen sulfite anion, a chloroaluminate anion, a tetrabromoaluminate anion, a nitrite anion, a nitrate anion, a dichloro cuprate anion, a phosphate anion, a hydrogen phosphate anion, a dihydrogen phosphate anion, a carbonate anion, a hydrogen carbonate anion, a sulfonate anion, a tosylate anion, or a bis(trifluoromethylsulfonyl)imide anion. In an embodiment, the ionic liquid may be an imidazolium salt, a pyridinium salt, a phosphonium salt, or an ammonium salt, and the anion may be $F^-$, $BF_4^-$, or $PF_6^-$. The ionic liquid may include 1-butyl-3-methylimidazolium tetrafluoroborate, 1-hexyl-3-methylimidazolium tetrafluoroborate, 1-hexyl-3-methylimidazolium hexafluorophosphate, or a combination thereof. One or more ionic liquids may be used, e.g., two or more salts may be used.

An amount of the ionic liquid or the hydrofluoric acid may be less than or equal to about 20 volume %, for example, about 0.01 volume % to about 20 volume %, or about 0.1 volume % to about 10 volume %, based on a total volume of the organic solvent in the reaction mixture. When the ionic liquid or the hydrofluoric acid is added, the produced quantum dot or the quantum dot polymer composite film may exhibit the improved luminance.

After the reaction is completed, a non-solvent may be added so that the organic ligand-coordinated nanocrystal may be separated (e.g., precipitated). The non-solvent may be a polar solvent that is miscible with the solvent used in the reaction and nanocrystals are not dispersible therein. The non-solvent may be selected depending the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if desired. The washing solvent has no particular limit and may have a similar solubility parameter to that of the ligand and may, for example, include hexane, heptane, octane, chloroform, toluene, benzene, and the like.

An embodiment provides an electronic device including the quantum dot. The electronic device may be a light emitting diode (LED), a sensor, an imaging sensor, a solar cell, or a liquid crystal display (LCD) device. The quantum dot according to an embodiment may be used in the device in a form of a quantum dot polymer composite.

Accordingly, in an embodiment, the quantum dot-polymer composite includes a polymer matrix; and a plurality of quantum dots dispersed in the polymer matrix, wherein the plurality of quantum dots includes the quantum dot. The quantum dot-polymer composite may be a film having a thickness of greater than or equal to about 5 μm, greater than or equal to about 6 μm, greater than or equal to about 7 μm and less than or equal to about 10 μm or less than or equal to about 9 μm. An amount of the quantum dot may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, greater than or equal to about 20 wt %, greater than or equal to about 21 wt %, greater than or equal to about 22 wt %, greater than or equal to about 23 wt %, greater than or equal to about 24 wt %, greater than or equal to about 25 wt %, greater than or equal to about 26 wt %, greater than or equal to about 27 wt %, greater than or equal to about 28 wt %, greater than or equal to about 29 wt %, or greater than or equal to about 30 wt %, based on a total weight of the quantum dot-polymer composite.

An amount of the polymer matrix may be greater than or equal to about 1 wt % and less than or equal to about 75 wt %, based on a total weight of the quantum dot-polymer composite. The polymer matrix may include a cross-linked polymer, a carboxylic acid-containing binder polymer, or a combination thereof.

The cross-linked polymer may include a thiolene resin, a cross-linked poly(meth)acrylate, a cross-linked polyurethane, a cross-linked epoxy resin, a cross-linked vinyl polymer, a cross-linked silicone resin, or a combination thereof. The cross-linked polymer may be synthesized by a suitable method or may be produced from commercially available monomers. For example, the monomers to provide the cross-linked poly(meth)acrylate polymer may be a di(meth)acrylate compound, a tri(meth)acrylate compound, a tetra(meth)acrylate compound, a penta(meth)acrylate compound, a hexa(meth) acrylate compound, or a combination thereof, but are not limited thereto. For example, the monomers to provide the cross-linked poly(meth)acrylate polymer may be ethylene glycoldi(meth)acrylate, triethylene glycoldi(meth)acrylate, diethylene glycoldi(meth)acrylate, 1,4-butanedioldi(meth)acrylate, 1,6-hexanedioldi(meth)acrylate, neopentylglycoldi(meth)acrylate, pentaerythritoldi(meth)acrylate, pentaerythritoltri(meth)acrylate, pentaerythritoltetra(meth)acrylate, dipentaerythritoldi(meth)acrylate, dipentaerythritoltri(meth)acrylate, dipentaerythritolpenta(meth)acrylate, dipentaerythritolhexa(meth)acrylate, bisphenol A epoxy(meth)acrylate, bisphenol A di(meth)acrylate, trimethylolpropanetri(meth)acrylate, novolac epoxy (meth)acrylate, ethylglycolmonomethylether(meth)acrylate, tris(meth)acryloyloxyethyl phosphate, propylene glycoldi(meth)acrylate, but are not limited thereto.

The cross-linked polyurethane, the cross-linked silicon, the cross-linked epoxy, and the like may be produced from a urethane polymer (or oligomer), a silicone polymer, and/or an epoxy polymer, each having polymerizable moieties (vinyl group or (meth)acrylate group), respectively. The thiolene resin may be produced by a radical polymerization of a thiol compound having at least two thiol groups (e.g., at both terminal ends) and an -ene compound having at least two carbon-carbon unsaturated bonds (e.g., at both terminal ends).

The carboxylic acid group-containing binder may include a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group; a multi-aromatic ring-containing polymer having a backbone structure in which two aromatic rings are bound to a quaternary carbon atom that is a constituent atom of another cyclic moiety in the main chain and including a carboxylic acid group; or a combination thereof.

In the carboxylic acid group-containing binder, an amount of a first repeating unit derived from the first monomer may be greater than or equal to about 5 mole percent (mol %), for example, greater than or equal to about 10 mol %, greater than or equal to about 15 mol %, greater than or equal to about 25 mol %, or greater than or equal to about 35 mol %. In the carboxylic acid group-containing binder, the amount of the first repeating unit may be less than or equal to about 95 mol %, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %. In the carboxylic acid group-containing binder, the amount of a second repeating unit derived from the second monomer may be greater than or equal to about 5 mol %, for example, greater than or equal to about 10 mol %, greater than or equal to about 15 mol %, greater than or equal to about 25 mol %, or greater than or equal to about 35 mol %. In the carboxylic acid group-containing binder, the amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 40 mol %, less than or equal to about 35 mol %, or less than or equal to about 25 mol %. In the carboxylic acid group-containing binder, if present, the amount of a third repeating unit derived from the third monomer may be greater than or equal to about 1 mol %, greater than or equal to about 5 mol %, greater than or equal to about 10 mol %, or greater than or equal to about 15 mol %. In the carboxylic acid group-containing binder, the amount of the third repeating unit may be less than or equal to about 40 mol %, for example, less than or equal to about 30 mol %, less than or equal to 25 mol %, less than or equal to 20 mol %, less than or equal to 18 mol %, less than or equal to 15 mol %, or less than or equal to or 10 mol %.

Examples of the first monomer may include carbonic acid vinyl ester compounds such as acrylic acid, methacrylic acid, crotonic acid, maleic acid, itaconic acid, fumaric acid, 3-butenoic acid, vinyl acetate, vinyl benzoate, and the like, but are not limited thereto. The first monomer may be at least one compound, e.g., two or more different compounds.

Examples of the second monomer may be an alkenyl aromatic compound such as styrene, α-methyl styrene, vinyl toluene, or vinyl benzyl methyl ether; an unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; an unsaturated carbonic acid amino alkyl ester compound such as 2-amino ethyl acrylate, 2-amino ethyl methacrylate, or 2-dimethyl amino ethyl acrylate 2-dimethyl amino ethyl methacrylate; a maleimide such as N-phenylmaleimide, N-benzylmaleimide, or N-alkylmaleimide; an unsaturated carbonic acid glycidyl ester compound such as glycidyl acrylate or glycidyl methacrylate; a vinyl cyanide compound such as acrylo nitrile or methacrylo nitrile; an unsaturated amide compound such as acryl amide or methacryl amide, but are not limited thereto. As the second monomer, at least one compound, e.g., two or more different compounds, may be used.

Examples of the third monomer may include 2-hydroxy ethyl acrylate, 2-hydroxy ethyl methacrylate, 2-hydroxy butyl acrylate, or 2-hydroxy butyl methacrylate, but are not limited thereto. As the third monomer, at least one compound, e.g., two or more different compounds, may be used.

The carboxylic acid group-containing binder may include a copolymer of (meth)acrylic acid and at least one monomer of alkyl (or aryl or arylalkyl) (meth)acrylate, hydroxyalkyl (meth)acrylate, or styrene. For example, the carboxylic acid group-containing binder may be a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer, or a combination thereof.

In the multi-aromatic ring-containing polymer, the backbone structure may include a repeating unit represented by Chemical Formula B:

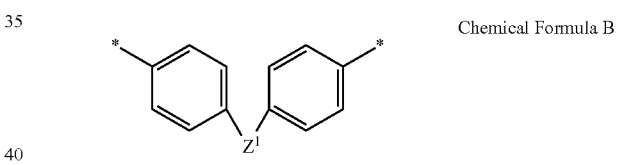

Chemical Formula B wherein, * is a portion that is linked to an adjacent atom of the main chain of the binder, and $Z_1$ is a linking moiety represented by any one of Chemical Formulae B-1 to B-6, and in Chemical Formulae B-1 to B-6, * is a portion that is linked to an aromatic moiety:

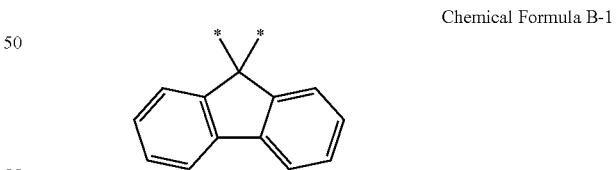

Chemical Formula B-1

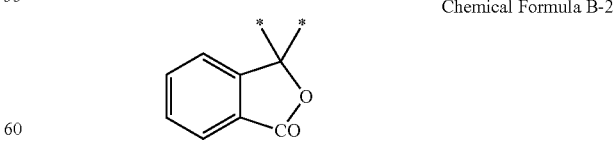

Chemical Formula B-2

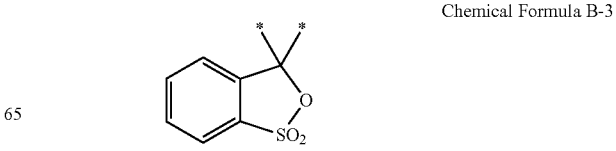

Chemical Formula B-3

Chemical Formula B-4

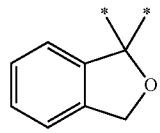

Chemical Formula C-1

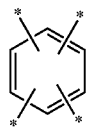

to wherein * is a portion that is linked to an adjacent carbonyl carbon,

Chemical Formula B-5

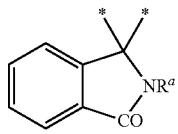

Chemical Formula C-2

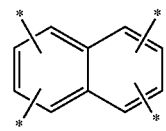

wherein, $R^a$ is a hydrogen, an ethyl group, $C_2H_4Cl$, $C_2H_4OH$, $CH_2CH=CH_2$, or a phenyl group, wherein * is a portion that is linked to an adjacent carbonyl carbon, Chemical Formula B-6

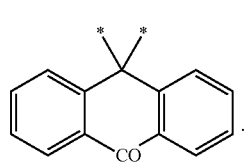

Chemical Formula C-3

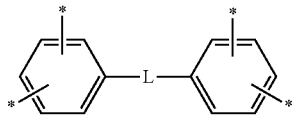

The multi-aromatic ring-containing polymer may include a repeating unit represented by Chemical Formula C:

Chemical Formula C

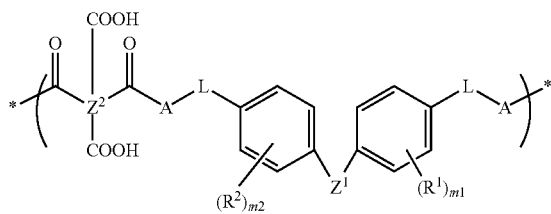

wherein * is a portion that is linked to an adjacent carbonyl carbon, L is a single bond, —O—, —S—, —C(=O)—, —CH(OH)—, —S(=O)$_2$—, —Si(CH$_3$)$_2$—, (CH$_2$)$_p$ (wherein 1≤p≤10), (CF$_2$)$_q$ (wherein 1≤q≤10), —CR$_2$— (wherein R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multi-aromatic ring-containing polymer may include a structural unit represented by Chemical Formula D;

Chemical Formula D

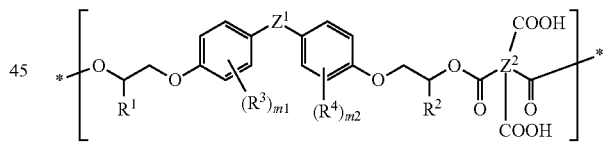

wherein $Z^1$ is a linking moiety represented by any one of Chemical Formulae B-1 to B-6, each L is the same or different and each is independently a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, each A is the same or different and each is independently —NH—, —O—, a C1 to C10 alkylene, or a combination thereof, and $Z^2$ is a C6 to C40 aromatic hydrocarbon group.

$R^1$ and $R^2$ are independently hydrogen, a halogen, or a substituted or unsubstituted C1 to C20 alkyl group, and m1 and m2 are independently an integer ranging from 0 to 4.

In Chemical Formula C, $Z^2$ may be one of Chemical Formula C-1, Chemical Formula C-2, and Chemical Formula C-3:

wherein, $R^1$ and $R^2$ are independently hydrogen or a substituted or unsubstituted (meth)acryloyloxyalkyl group, $R^3$ and $R^4$ are independently hydrogen, a halogen, or a substituted or unsubstituted C1 to C20 alkyl group, $Z^1$ is a linking moiety represented by Chemical Formulae B-1 to B-6, $Z^2$ is an aromatic hydrocarbon group such as the moieties set forth above, and m1 and m2 are independently an integer ranging from 0 to 4. In an embodiment, the multi-aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrine to obtain an epoxy compound having a fluorene moiety, and the epoxy compound is reacted with an acrylic acid to obtain a fluorenyl epoxy acrylate, which is then further reacted with biphenyldianhydride and/or phthalic anhydride. The reaction scheme may be summarized as below:

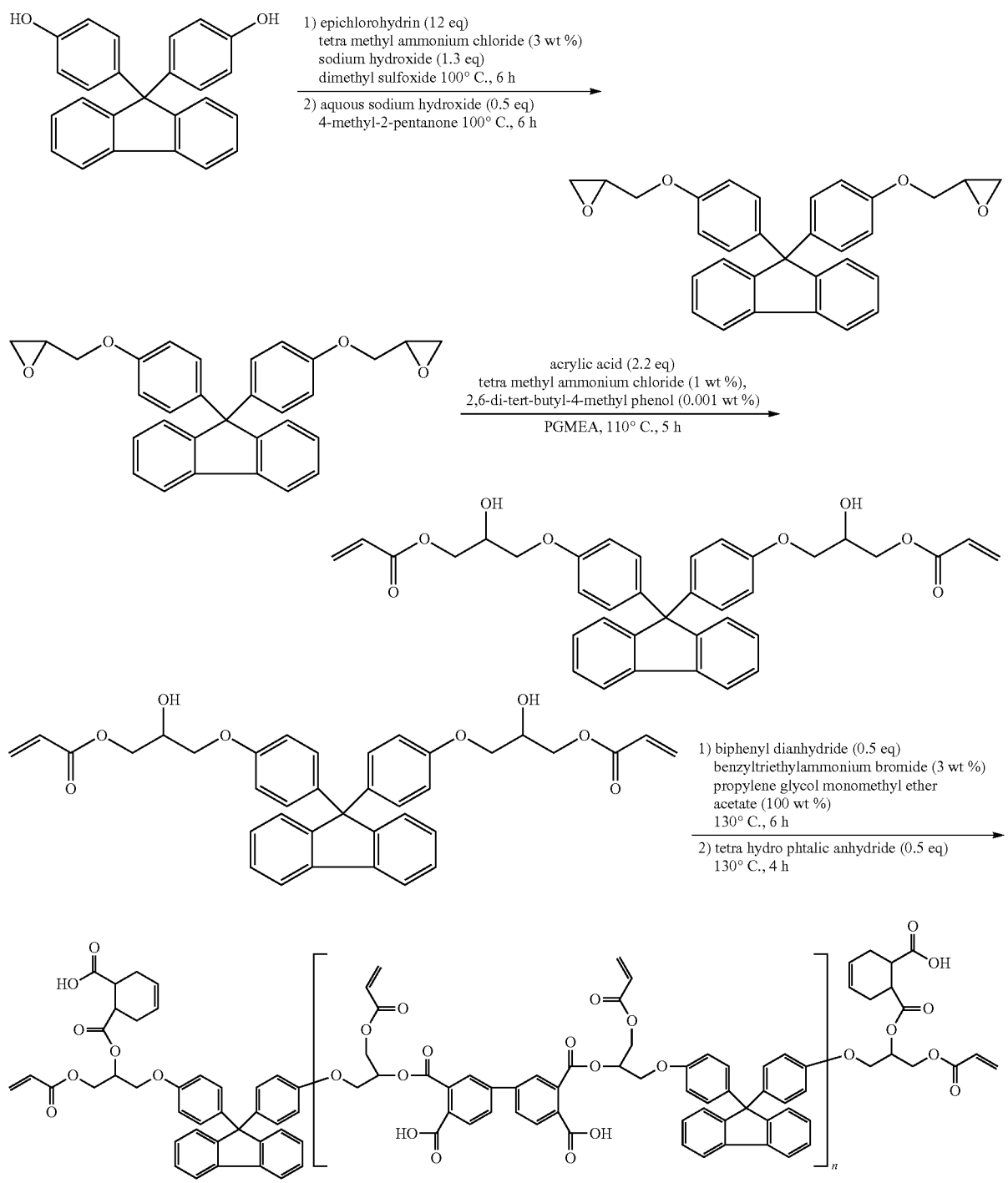
The multi-aromatic ring-containing polymer may include a functional group represented by Chemical Formula E at one or both terminal ends:
wherein, $Z^3$ is a moiety represented by one of Chemical Formulae E-1 to E-7:
Chemical Formula E
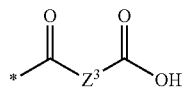
Chemical Formula E-1
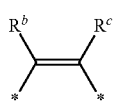

wherein, $R^b$ and $R^c$ are independently a hydrogen atom, a substituted or unsubstituted C1 to C20 alkyl group, an ester group, or an ether group,

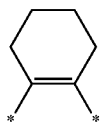

Chemical Formula E-2

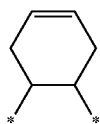

Chemical Formula E-3

Chemical Formula E-4

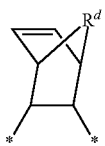

Chemical Formula E-5 wherein, $R^d$ is O, S, NH, a substituted or unsubstituted C1 to C20 alkylene group, a C1 to C20 alkylamine group or a C2 to C20 alkenylamine group.

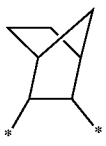

Chemical Formula E-6

Chemical Formula E-7

The multi-aromatic ring-containing polymer may be synthesized or commercially available (e.g., from Nippon Steel Chemical Co., Ltd.).

The multi-aromatic ring-containing polymer may include a reaction product of a fluorene compound of 9,9-bis(4-hydroxyphenyl)fluorene, 9,9-bis(4-aminophenyl)fluorene, 9,9-bis[4-(glycidyloxy)phenyl]fluorene, or 9,9-bis[4-(2-hydroxyethoxy)phenyl]fluorene with a desirable compound capable of reacting with the fluorene compound (e.g., an aromatic dianhydride of 9,9-bis-(3,4-dicarboxyphenyl)fluorene dianhydride, pyromellitic dianhydride (PMDA), biphenyltetracarboxylic dianhydride (BPDA), benzophenone tetracarboxylic dianhydride, or naphthalene tetracarboxylic dianhydride, a C2 to C30 diol compound, epichlorohydrine, or the like).

The fluorene compound, dianhydride, diol compound, and the like are commercially available, and the reaction conditions therebetween may be readily discerned by one of skill in the art.

The carboxylic acid group-containing binder may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The carboxylic acid group-containing binder may have a molecular weight of less than or equal to about 100,000 g/mol, for example, less than or equal to about 50,000 g/mol. Within the ranges, developability may be improved.

The carboxylic acid group-containing binder may have an acid value of greater than or equal to about 50 milligrams of potassium hydroxide (KOH) per gram (mg KOH/g). For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the binder may be, for example, less than or equal to 250 mg KOH/g, for example, less than or equal to 240 mg KOH/g, less than or equal to 230 mg KOH/g, less than or equal to 220 mg KOH/g, less than or equal to 210 mg KOH/g, less than or equal to 200 mg KOH/g, less than or equal to 190 mg KOH/g, less than or equal to 180 mg KOH/g, or less than or equal to 160 mg KOH/g, but is not limited thereto.

The composite may further include a metal oxide particulate. The metal oxide particulate may have an average particle size of greater than or equal to about 30 nm, for example, greater than or equal to about 100 nm, greater than or equal to about 150 nm, greater than or equal to about 160 nm, greater than or equal to about 170 nm, greater than or equal to about 180 nm, or greater than or equal to about 190 nm. The metal oxide particulate may have an average particle size of less than or equal to about 1,000 nm, less than or equal to about 900 nm, less than or equal to about 800 nm, less than or equal to about 700 nm, less than or equal to about 600 nm, or less than or equal to about 500 nm. The metal oxide particulate may have an average particle size of about 100 nm to about 500 nm or about 190 nm to about 450 nm. The size of the particulate may be selected considering amounts of the other components in the composition, a film thickness of the composite, and the like.

The metal oxide particulate may include titanium oxide, silicon oxide, barium oxide, zinc oxide, or a combination thereof. The metal oxide particulate may include $TiO_2$, $SiO_2$, $BaTiO_3$, $Ba_2TiO_4$, ZnO, or a combination thereof. An amount of the metal oxide particulate may be greater than or equal to about 0.5 wt %, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt %, based on a total weight of the composite. An amount of the metal oxide particulate may be less than or equal to about 60 wt %, less than or equal to about 50 wt %, less than or equal to about 40 wt %, less than or equal to about 35 wt %, based on a total amount of a solid content. Within the ranges of the particle size range and the amount, the metal oxide particulate may improve luminous efficiency of the quantum dot-polymer composite (or a pattern thereof) produced from the photosensitive composition.

The quantum dot-polymer composite may be produced in a form of a pattern. A non-limiting method of forming a pattern is explained referring to FIG. 1. A composition including the quantum dot, the carboxylic acid group-containing binder, a photopolymerizable monomer (the (meth) acrylate monomer), and a photoinitiator is coated on a predetermined substrate (for example, a glass substrate or a glass substrate coated with a protective layer (e.g., SiNx) with a predetermined thickness (e.g., 500 to 1,500 angstroms (Å))) using a desirable method such as a spin coating or a slit coating to form a film of a predetermined thickness (e.g., a thickness of about 5 μm to about 30 μm). The formed film may be pre-baked at a predetermined temperature (e.g., a temperature around a boiling point of the used solvent), if desired. A temperature, time, or atmosphere may be desirably selected. The formed (or optionally pre-baked) film is exposed to light (e.g., ultraviolet (UV) light) having a predetermined wavelength under a mask having a predetermined pattern. A wavelength and intensity of the light may be selected considering the types and amounts of the photoinitiator, and the types and amounts of the quantum dots, and the like. The exposed film is treated (e.g., dipped or sprayed) with an alkali developing solution and thus a non-irradiated portion of the film is dissolved to form a desirable pattern. The obtained pattern may be post-baked at a temperature of about 150° C. to about 230° C. for a predetermined time (e.g., greater than or equal to about 10 minutes or greater than or equal to about 20 minutes), if desired, in order to improve crack resistance and solvent resistance of the pattern. When the quantum dot-polymer composite is used as a color filter, two or three kinds of compositions including red quantum dots, green quantum dots, (or optionally, blue quantum dots) are prepared, the pattern forming process is repeated a desired number of times (e.g., at least twice or at least three times) for each composition to the quantum dot-polymer composite having a desirable pattern.

Figure 2:
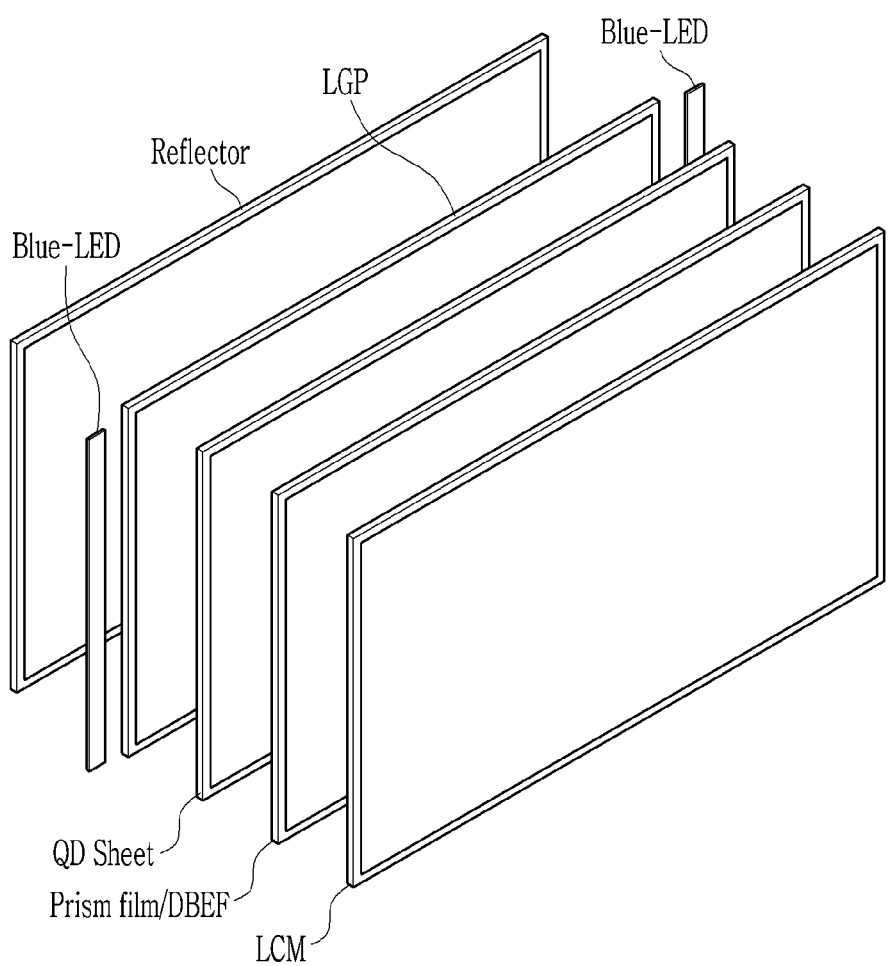
FIG. 2 is a schematic view showing a cross-section of a photoluminescence device according to an embodiment.

In an embodiment, a photoluminescence display device includes the quantum dot polymer composite. Referring to FIG. 2, the photoluminescence display device (e.g., liquid crystal display device) may include a reflector, a light guide panel (LGP), an LED light source (e.g., Blue-LED), a quantum dot-polymer composite sheet (QD sheet), and various laminated optical films (e.g., prism film, a double brightness enhance film (DBEF), etc.). A liquid crystal panel module (LCM) may be disposed on the optical films.

In an embodiment, the luminescence device or a display device including the same includes a substrate and a patterned layer disposed on the substrate, wherein the patterned layer (hereinafter, also referred to as a luminescent layer or a light emitting element) is on a substrate and has a first section configured to emit a first light and a second section configured to emit a second light having a different wavelength from the first light, and at least one of the first section and the second section may include the quantum dot-polymer composite. The luminescent layer may further include a third section configured to emit or pass a third light (e.g., a blue light), the third light being different from the first and second lights. For example, the third section includes a blue light emitting quantum dot and/or a light transmitting polymer. The luminescent layer may include a black matrix that may optically isolate each of the sections.

The substrate may include a transparent material and may also include an insulating material, and thus may be both an insulating and transparent substrate. The substrate may include glass, a polymer, an inorganic material such as $Al_2O_3$ or ZnO, or a combination thereof, but is not limited thereto. The polymer may include a polyester such as polyethylene terephthalate (PET) or polyethylene naphthalate (PEN), polycarbonate, polyimide, polyamide-imide, a poly(C1-C6 alkyl) (meth)acrylate, poly(meth)acrylic acid, a thiolene polymer, polysiloxane (e.g., PDMS), ora combination thereof.

As used herein, the term "transparent" refers to having a light transmittance of greater than or equal to about 85%, for example, greater than or equal to about 88%, greater than or equal to about 90%, greater than or equal to about 95%, greater than or equal to about 97%, or greater than or equal to about 99% for a predetermined wavelength of light (e.g., light emitted from the quantum dots). A thickness of the (transparent) substrate may be appropriately selected considering a substrate material but is not particularly limited. The (transparent) substrate may have flexibility. The (transparent) substrate may be an upper substrate of a liquid crystal panel for a liquid crystal display device. At least a portion of the substrate may be configured to cut (absorb or reflect) blue light. A layer capable of blocking (e.g., absorbing or reflecting) blue light, also referred to herein as a "blue cut layer" or "blue light absorption layer", may be disposed on at least one surface of the substrate. For example, the blue cut layer (blue light absorption layer) may include an organic material and a predetermined dye, such as, for example, a yellow dye or a dye capable of absorbing blue light and transmitting green and/or red light.

The first light may be red light and the first section may include a red light emitting quantum dot, but are not limited thereto. The second light may be green light and the second section may include a green light emitting quantum dot, but are not limited thereto. The first light may be green light and the first section may include a green light emitting quantum dot. The second light may be red light and the second section may include a red light emitting quantum dot. A maximum (photo)luminescence peak wavelength (also referred to as "a peak wavelength") of the green light may be in a range of greater than about 480 nm and less than or equal to about 580 nm, for example, in a range of greater than about 500 nm and less than or equal to about 550 nm, or from 500 nm to 540 nm. A maximum photoluminescence peak wavelength of the red light may be in a range of greater than about 580 nm and less than or equal to about 680 nm, for example, in a range of greater than about 610 nm and less than or equal to about 640 nm, or from 600 nm to 650 nm. A maximum photoluminescence peak wavelength of the blue light may be in a range of greater than or equal to about 380 nm (e.g., greater than or equal to about 440 nm) and less than or equal to about 480 nm (or less than or equal to about 470 nm).

The patterned layer including the quantum dot polymer composite may be obtained by the method.

The light source may be configured to provide incident light to the light emitting element including the patterned layer. The incident light may have a photoluminescence peak wavelength of about 440 nm to about 480 nm such as about 440 nm to about 470 nm. The incident light may be the third light.

Figure 3B:
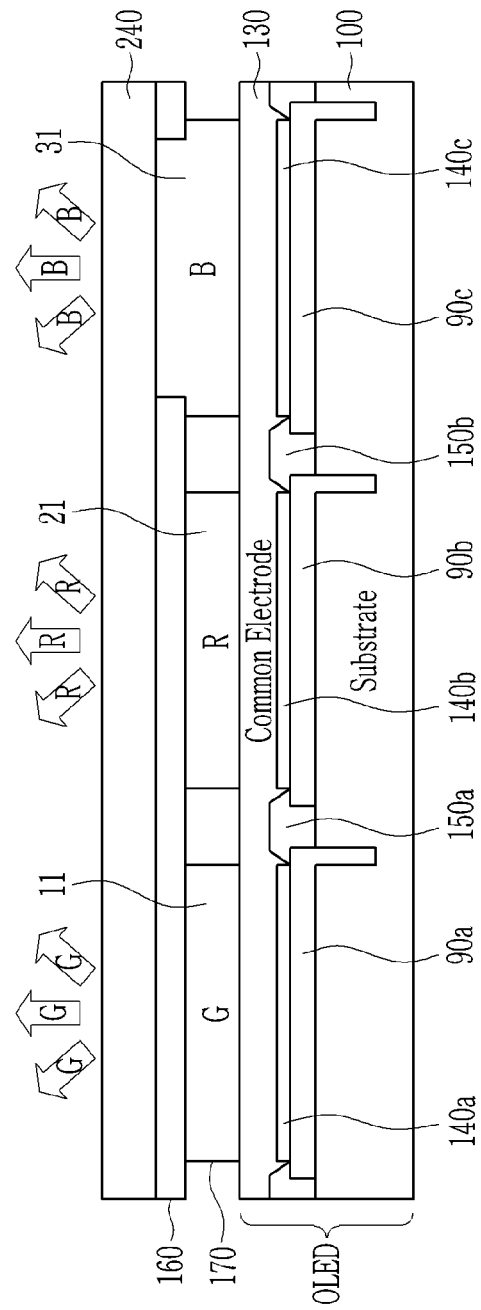

FIG. 3A and FIG. 3B show a schematic cross-sectional view of a display including a patterned layer of an embodiment. Referring to FIG. 3A and FIG. 3B, the light source may include an organic light emitting diode (OLED). For example, the OLED may emit blue light or a light having a wavelength in a region of about 500 nm or less. The organic light emitting diode OLED may include (at least two) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode. The pixel areas of the OLED may be disposed corresponding to the first, second, and third sections that will be described in detail below, respectively.

The layered structure that includes a quantum dot-polymer composite pattern (e.g., including a first repeating section including green light emitting quantum dots and/or a second repeating section including red light emitting quantum dots) and a substrate, or the quantum dot-polymer composite pattern, may be disposed on or over a light source, for example, directly on the light source.

The light (e.g., blue light) emitted from the light source may enter the second section 21 and the first section 11 of the pattern to emit (e.g., converted) red light R and green light G, respectively. The blue light B emitted from the light source passes through or transmits from the third section 31. Over the second section 21 emitting red light and/or the first section 11 emitting green light, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern 170 and over the first section 11 and the second section 21. Details of the blue cut layer are the same as set forth for the first optical filter 310 below.

The device may be fabricated by separately preparing the layered structure and the OLED (for example, the blue OLED), respectively, and combining them. The device may be fabricated by directly forming the pattern of the quantum dot-polymer composite over the OLED.

In an embodiment, the display device may further include a lower substrate 210, an optical element (e.g., polarizer) 300 disposed below the lower substrate 210, and a liquid crystal layer 220 interposed between the layered structure and the lower substrate 210. The layered structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. The light source may further include an LED and optionally a light guide panel.

Figure 3C:
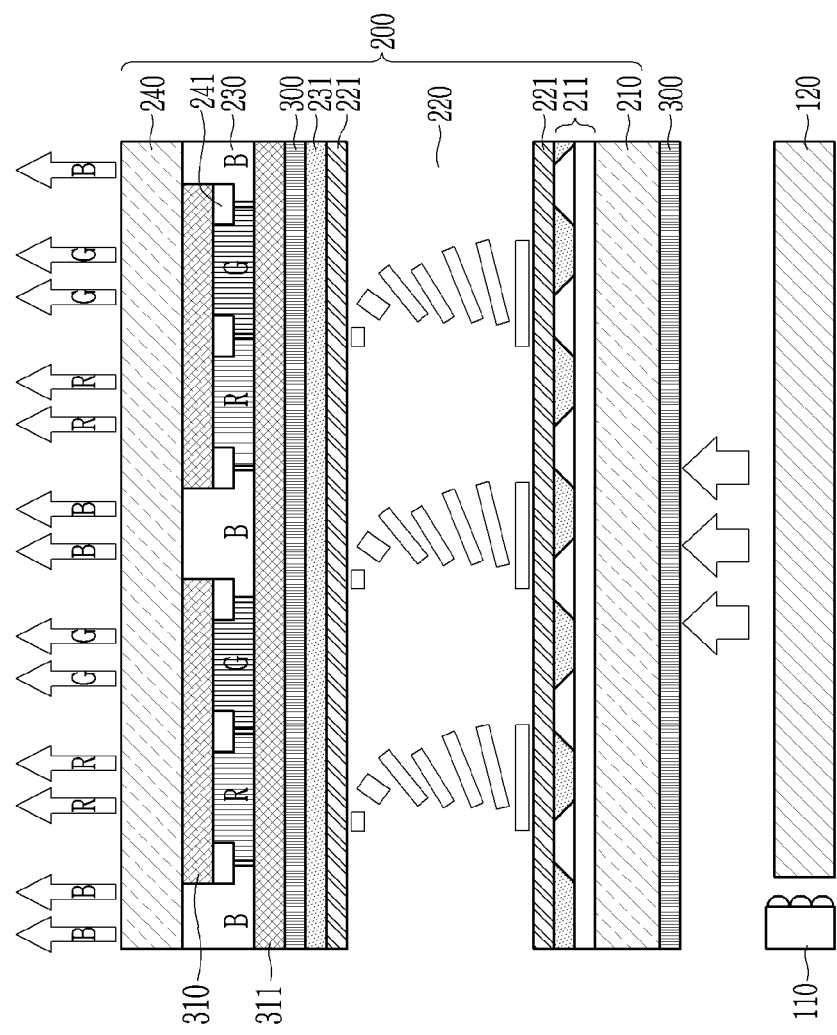

Referring to FIG. 3C, in an embodiment, the display device includes a liquid crystal panel 200, an optical element 300 (e.g., polarizer) disposed on and/or under the liquid crystal panel 200, and a backlight unit including a blue light emitting light source 110 under a lower optical element 300. The backlight unit may include a light source 110 and a light guide 120 (edge type). The backlight unit may be a direct light source without a light guide. The liquid crystal panel 200 may include a lower substrate 210, an upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

A wire plate 211 is provided on an internal surface, for example, on the upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited.

In an embodiment, an upper optical element or an upper polarizer 300 may be provided between the liquid crystal layer 220 and the upper substrate 240, but it is not limited thereto. For example, the upper optical element or polarizer 300 may be disposed between the liquid crystal layer 220 (or a common electrode 231) and the light emitting layer (or the quantum dot-polymer composite pattern). A black matrix 241 may be provided under the upper substrate 240 (e.g., on a lower surface thereof). Openings within the black matrix 241 are aligned with a gate line, a data line, and a thin film transistor of a wire plate 211 on the lower substrate 210. A second section (R) including a color filter emitting red light, a first section (G) including a color filter emitting green light and/or a third section (B) including a color filter for emitting or transmitting blue light may be disposed in the openings within the black matrix 241. For example, the black matrix 241 may have a lattice shape. The light emitting layer (color filter layer) 230 may be on a transparent common electrode 231.

If desired, the display device may further include a blue cut filter, hereinafter, also referred to as a first optical filter layer. The first optical filter layer 310 may be disposed between upper surfaces of the second section (R) and the first section (G) and the lower surface of the upper substrate 240, or on an upper surface of the upper substrate (240). The first optical filter layer 310 may include a sheet having openings that correspond to the third section (B) (e.g., a pixel area showing a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. At least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., the mixed light of the green light and the red light).

The first optical filter layer may include a polymer thin film including a dye and/or a pigment that absorbs light having a specific wavelength, i.e., the wavelength to be blocked. The first optical filter layer may block at least 80%, at least 90%, or at least 95% of blue light having a wavelength of less than or equal to about 480 nm. With respect to the visible light having other wavelengths (e.g., light having a wavelength of greater than about 500 nm and less than or equal to about 700 nm), the first optical filter layer may have a light transmittance of greater than or equal to about 70%, for example, greater than or equal to about 80%, or greater than or equal to about 90%, up to 100%.

The first optical filter layer may absorb and substantially block blue light having a wavelength of less than or equal to about 500 nm, and for example, may selectively transmit green light or red light. At least two first optical filter layers may be spaced apart and disposed on each of the portions overlapping the first and second sections, respectively. For example, the first optical filter layer selectively transmitting red light may be disposed on the portion overlapping the section emitting red light and/or the first optical filter layer selectively transmitting green light may be disposed on the portion overlapping the section emitting green light.

In some embodiments, the first optical filter layer may include at least one of a first region and a second region. The first region of the first optical filter layer blocks (e.g., absorbs) blue light and red light and transmits green light (e.g., having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm). The second region of the first optical filter layer blocks (e.g., absorb) blue light and green light and transmits red light (e.g., having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm). The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different reflective index. For example, in the first optical layer, two layers having different reflective indices may be alternately stacked on each other. For example, a layer having a high reflective index and a layer having a low reflective index may be alternately laminated with each other.

The display device may further include a second optical filter layer 311 (e.g., red/green light or yellow light recycling layer) that is disposed between the light emitting layer 230 and the liquid crystal layer 220, and between the light emitting layer 230 (e.g., the quantum dot polymer composite layer) and the upper polarizer 300. The second optical filter layer 311 may transmit at least a portion of a third light, and reflect at least a portion of a first light and/or a second light. The second optical filter layer may reflect light having a wavelength of greater than 500 nm. The first light may be green (or red) light, the second light may be red (or green) light, and the third light may be blue light.

In an embodiment, an electroluminescent device includes a first electrode (e.g., anode) and a second electrode (e.g., cathode) facing each other; and a quantum dot emission layer disposed between the first electrode and the second electrode. The quantum dot emission layer includes a plurality of quantum dots, wherein the plurality of quantum dots include the quantum dot.

Figure 4:
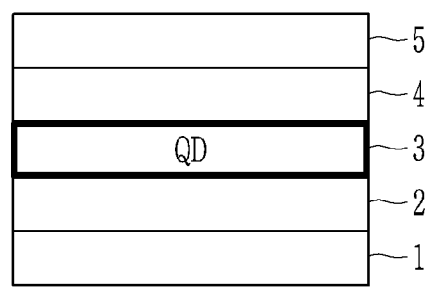
FIG. 4 is a schematic view showing a cross-section of an electroluminescent device according to an embodiment.

Referring to FIG. 4, the electroluminescent device may include a charge (hole or electron) auxiliary layer between the anode 1 and the cathode 5. For example, the electronic device may include a hole auxiliary layer 2 or an electron auxiliary layer 4 between the anode 1 and the quantum dot (QD) emission layer 3 and/or between the cathode 5 and the quantum dot (QD) emission layer 3.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be desirably selected. For example, each thickness of the layer may be greater than or equal to about 1 nm and less than or equal to about 500 nm, but is not limited thereto. The hole injection layer may be an organic layer that is formed by a solution process (e.g., spin coating etc.) such as poly(3,4-ethylenedioxythiophene):poly(styrene sulfonate) (PEDOT:PSS). The hole transport layer may be an organic layer that is formed by a solution process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be desirably selected. For example, each thickness of the layer may be greater than or equal to about 1 nm and less than or equal to about 500 nm, but is not limited thereto. The electron injection layer may be an organic layer formed by deposition. The electron transport layer may include an inorganic oxide nanoparticle or may be an organic layer formed by deposition.

The quantum dot emission layer may be disposed in the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be a compound having hole or electron-related properties. The inorganic material may be for example a metal oxide such as molybdenum oxide, tungsten oxide, zinc oxide, or nickel oxide, but is not limited thereto.

The hole transport layer (HTL) and/or hole injection layer may include, each independently, for example poly(3,4-ethylenedioxythiophene):poly(styrene sulfonate) (PEDOT: PSS), poly(9,9-dioctyl-fluorene-co-N-(4-butylphenyl)-diphenylamine) (TFB), polyarylamine, poly(N-vinylcarbazole), polyaniline, polypyrrole, NN,N,N',N'-tetrakis (4-methoxyphenyl)-benzidine (TPD), 4-bis[N-(1-naphthyl)-N-phenyl-amino]biphenyl (alpha-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), a p-type metal oxide (e.g., NiO, WO$_3$, MoO$_3$, etc.), a carbon-based material such as graphene oxide, or a combination thereof, but is not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (alpha-NPD), m-MTDATA, 4,4',4''-tris(N-carbazolyl)-triphenylamine (TCTA), or a combination thereof, but is not limited thereto.

The electron transport layer (ETL) and/or electron injection layer may, each independently, include for example 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-4-(4,6-di(naphthalen-2-yl)-1,3,5-triazin-2-yl)phenyl)quinolone), 8-hydroxyquinolinato lithium (Liq), an n-type metal oxide (e.g., ZnO, HfO$_2$, etc.), or a combination thereof, but is not limited thereto. The n-type metal oxide may be crystalline. The n-type metal oxide may include a nanosized particle. The electron transport layer (ETL) may include crystalline nanoparticles including a zinc oxide compound (e.g., ZnO).

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, Alq$_3$, Gaq$_3$, Inq$_3$, Znq$_2$, Zn(BTZ)$_2$, BeBq$_2$, or a combination thereof, but is not limited thereto.

In the foregoing "q" is 8-hydroxyquinoline, "BTZ" is 2-(2-hydroxyphenyl) benzothiazolate, and "Bq" is 10-hydroxybenzo[h]quinoline. The n-type metal oxide may be crystalline.

Hereinafter, specific examples are illustrated. However, these examples are exemplary, and the present disclosure is not limited thereto.

EXAMPLES

Analysis Method
1. UV Spectroscopy Analysis and Photoluminescence Analysis

A UV spectroscopy analysis is performed by using a Hitachi U-3310 spectrometer to obtain a UV-Visible absorption spectrum.

A photoluminescence (PL) spectrum analysis is performed using a Hitachi F-7000 spectrometer to obtain a PL spectrum.

2. XPS Analysis

Quantum 2000 made by Physical Electronics, Inc. is used to perform an XPS element analysis under the conditions of an acceleration voltage: 0.5 to 15 kiloelectron volts (keV), 300 watts (W), and a minimum analysis area: 200×200 square micrometers (μm$^2$).

3. Inductively Coupled Plasma Atomic Emission Spectroscopy (ICP-AES) Analysis

ICP-AES analysis is performed using Shimadzu ICPS-8100.

4. Conversion Efficiency (CE)

(1) The conversion efficiency is a ratio of the photoluminescence amount of the quantum dot polymer composite relative to the light amount in which the quantum dot polymer composite absorbs from the excited light. The total light amount (B) of excited light (i.e., blue light) is obtained by integrating the PL spectrum of the excited light, and the PL spectrum of the quantum dot composite film is measured, so the light amount (A) of green or red wavelength light and the light amount (B') of blue light emitted from the quantum dot composite film are obtained to provide a conversion efficiency by the following equation:

$A/(B-B')\times 100$=conversion efficiency (%)

The conversion efficiency as defined above is a front conversion efficiency.

In Examples and Comparative Examples, an amount of the quantum dot used for a production of a quantum dot film for measuring a conversion efficiency is adjusted to be within a predetermined amount (considering a weight of the used polymer). The produced quantum dot polymer composite film is inserted between a light guide panel and an optical sheet of 60-inch TV mounted with a blue LED having a peak wavelength of 458 nanometers (nm). The TV is driven and a photoluminescence spectrum of quantum dot-polymer composite film is obtained by using a PSI DARSA-5200 spectrometer placed about 45 cm in front of the TV. A photo-conversion efficiency (CE) is calculated based on the aforementioned equation by using the results of the photoluminescence spectrum.

(2) The quantum dot polymer composite film is produced as follows.

A quantum dot chloroform dispersion is prepared by mixing a binder (a quaternary copolymer of methacrylic acid, benzyl methacrylate, hydroxyethylmethacrylate, and styrene, acid value: 130 mg KOH/g, molecular weight: 8000, methacrylic acid:benzylmethacrylate:hydroxyethylmethacrylate:styrene (mole ratio)=61.5%:12%:16.3%:10.2%) solution (propylene glycolmonomethyl ether acetate having a concentration of 30 wt %) in a predetermined weight ratio to prepare quantum dot-binder dispersion.

Glycoldi-3-mercaptopropionate (hereinafter, 2T) having the following structure, hexaacrylate having the following structure a photopolymerizable monomer, an oximeester compound having the following structure as an initiator, and propylene glycol methyl ether acetate (PGMEA) with the quantum dot binder dispersion to prepare a photosensitive composition.

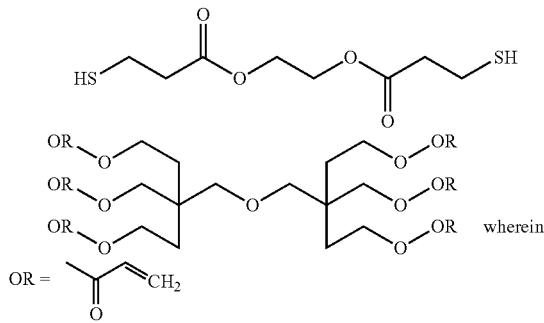

The prepared photosensitive composition includes 10.75 wt % of the quantum dot, 6.2 wt % of the binder, 2.25 wt % of the photopolymerizable monomer, 0.5 wt % of the initiator, and 5.3 wt % of the multiple thiol compound. A total solid content of the composition is 25% and a weight content of the total QD (TQWC) of the solid is 45%.

The prepared photosensitive composition is spin-coated on a glass substrate at 180 rpm for 5 seconds to provide a film (thickness: about 6 micrometers (μm)). The obtained film is pre-baked (PRB) at 100° C. to measure conversion efficiency. The pre-baked film is exposed to light (wavelength: 365 nm, intensity: 100 millijoules (mJ) for 1 second to obtain a quantum dot polymer composite. The obtained composite is post-baked at 180° C. for 30 minutes to measure conversion efficiency.

Quantum Dot Synthesis

Reference Example 1: Preparation of InZnP Core

A 1-octadecene solution including 0.2 millimoles (mmol) of indium acetate, 0.125 mmol of zinc acetate, and 0.6 mmol of palmitic acid is prepared in 300 milliliters (mL) of a reaction flask and is heated at 120° C. under vacuum. In one hour, an atmosphere in the reactor is converted into nitrogen. After heating the solution to a high temperature of 250° C., a mixed solution including 0.15 mmol of tris(trimethylsilyl) phosphine (TMS3P) and 1 mL of trioctylphosphine is rapidly injected thereto and reacted for 20 minutes. Acetone is added to the reaction solution rapidly cooled down to room temperature and a precipitate centrifuged therefrom is dispersed in toluene or cyclohexane. From a UV spectroscopy result of the obtained InZnP core, it is confirmed that a UV first absorption maximum wavelength is 430 nm and a core diameter is about 2.1 nm.

Reference Example 2: Preparation of InP Core

An InP core is obtained according to the same manner as Reference Example 1 except that 0.125 mmol of zinc acetate is not used. From a UV spectroscopy result of the InP semiconductor nanocrystal, it is confirmed that a UV first absorption maximum wavelength is 550 nm and a core diameter is about 3.3 nm.

Example 1

1. 0.6 mmol of zinc acetate and 1.2 mmol of oleic acid oleic acid are dissolved in a trioctylamine solvent in 300 mL of a reaction flask and the resultant is vacuum-treated at 120° C. for 10 minutes. The flask is internally substituted with nitrogen ($N_2$), and the reactor is heated up to 280° C. to obtain a stock solution.

The InZnP core prepared in Reference Example 1 and a predetermined amount of Se/TOP are added to the stock solution and a predetermined amount of S/TOP is added in each 4 step, and the resultant is heated up to 320° C. to perform a shell formation reaction. Before the reaction or during the reaction, hydrofluoric acid or ionic liquid is added to the stock solution.

Added Se and S amounts in each step and reaction times are controlled so that a shell of ZnSe/ZnSeS (excess amount of Se)/ZnSeS (excess amount of S)/ZnS composition is formed on the InZnP core. In each step, a mole ratio of Se/TOP and S/TOP is selected within a range of S:Se=0:6 to 6:0. In the first step, only Se/TOP is added and in a final step, only S/TOP is added to form a ZnSe layer on the InZnP core and a ZnS layer at an outermost layer. In the intermediate steps, both Se/TOP and S/TOP are used to form a shell including ZnSeS (second semiconductor nanocrystal). A total amount of selenium is 0.3 mol and a total amount of sulfur is 0.9 mol.

In the intermediate steps or the final step, 0.04 mmol of hafnium isopropoxide is added. In each reaction step, a reaction time is about 15 minutes.

After the final reaction step, the obtained reaction products are cooled to room temperature (e.g., 20° C.). Ethanol is added to the cooled reaction mixture to form a precipitate. The formed precipitate is centrifuged to a green light emitting quantum dot including a hafnium dopant. The obtained quantum dot is dispersed in toluene.

2. A photoluminescence analysis of the produced quantum dot is performed using excited light of 450 nm. The results are shown in Table 1.

A quantum dot-polymer composite film using the quantum dot is produced and conversion efficiency is measured. The results are shown in Table 2.

An ICP-AES analysis of the produced quantum dot is performed and the results are shown in Table 3.

Figure 5:
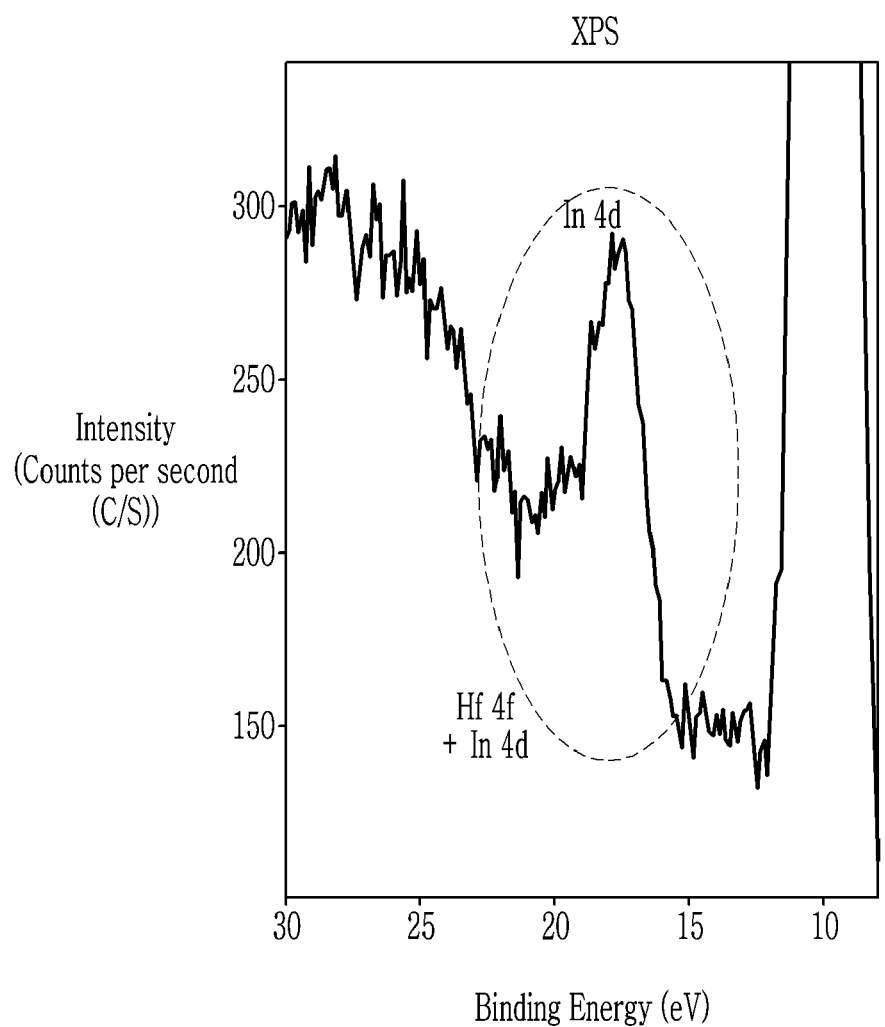
FIGS. 5 and 6 show parts of X-ray photoelectron spectroscopy (XPS) analysis results of quantum dots produced in Example 1.
Figure 6:
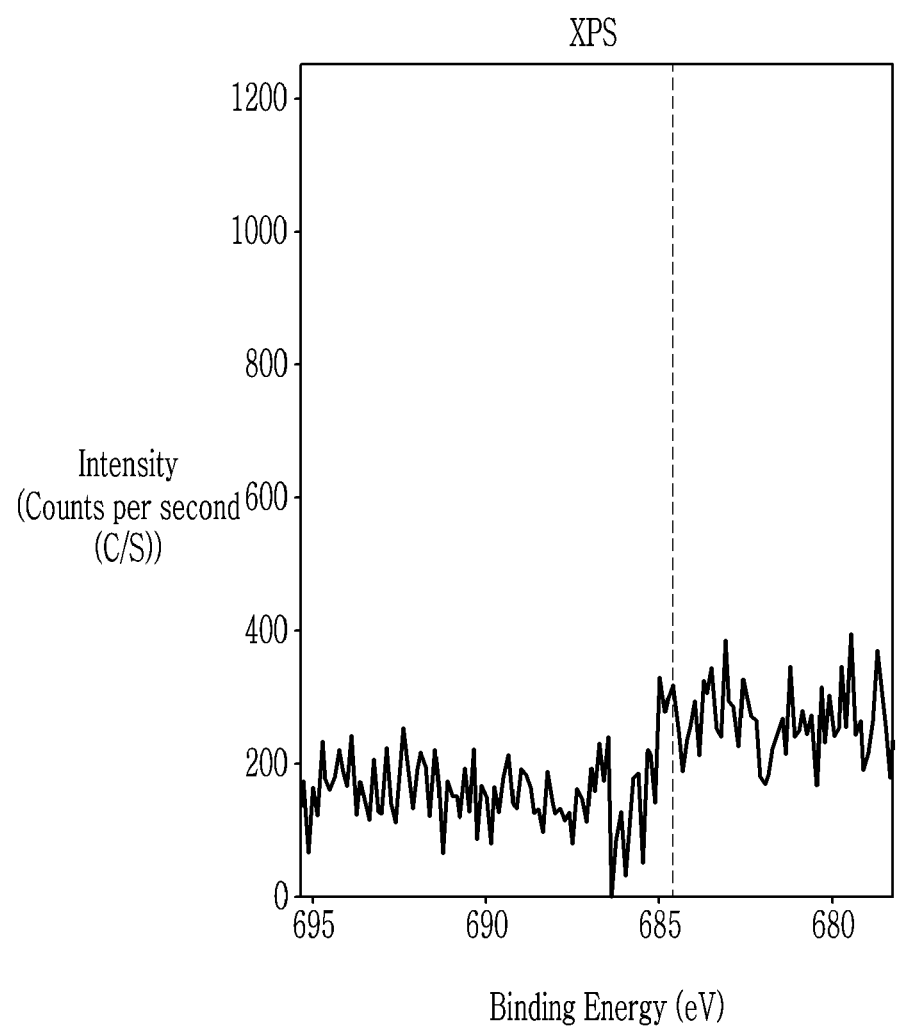

An XPS analysis of the produced quantum dot is performed and parts of the results are shown in FIGS. 5 and 6. From the results of FIG. 5, it is confirmed that the quantum dot of Example 1 includes hafnium. From the results of FIG. 6, it is confirmed that the quantum dot of Example 1 includes fluorine as a non-metal dopant.

Comparative Example 1

1. A green light emitting quantum dot is obtained according to the same manner as Reference Example 1 except that hafnium isopropoxide is not used.

2. A photoluminescence analysis of the produced quantum dot is performed using excited light of 450 nm. The results are shown in Table 1.

A quantum dot-polymer composite film using the quantum dot is produced and conversion efficiency is measured. The results are shown in Table 2.

An ICP-AES analysis of the produced quantum dot is performed and the results are shown in Table 3.

TABLE 1

| | UV first absorption peak (nm) | Photoluminescence wavelength (nm) | Full width at half maximum (FWHM) (nm) | QY (%) |
|---|---|---|---|---|
| Example 1 | 505 | 531 | 36 | 90 |
| Comparative Example 1 | 505 | 530 | 35.7 | 85 |

From the results of Table 1, hafnium-doped quantum dot of Example 1 exhibits improved luminous efficiency compared with undoped quantum dot.

TABLE 2

| | CE after POB (%) | Process maintenance rate[1] |
|---|---|---|
| Example 1 | 33 | 97% |
| Comparative Example 1 | 28 | 93% |

Note
[1]process maintenance rate = (CE after POB/CE after PRB) × 100

From the results of Table 2, the quantum dot polymer composite including the quantum dot of Example 1 exhibits improved luminous efficiency and improved stability (e.g., thermal stability) even after heat treatment at a high temperature compared with the quantum dot polymer composite including the quantum dot of Comparative Example 1.

TABLE 3

| | Mole ratio (X/In) | | | | | |
|---|---|---|---|---|---|---|
| | P/In | S/In | Zn/In | Se/In | In/In | Hf/In |
| Comparative Example 1 | 0.684 | 11.63 | 27.68 | 11.63 | 1.00 | 0 |
| Example 1 | 0.222 | 11.94 | 30.22 | 12.17 | 1.00 | 0.042 |

Example 2

1. A red light emitting quantum dot including a hafnium dopant is obtained according to the same manner as Example 1 except that the core of Reference Example 2 is used instead of the core of Reference Example 1 and 0.3 mmol of hafnium isopropoxide is used.
2. A photoluminescence analysis of the produced quantum dot is performed using excited light of 450 nm. The results are shown in Table 4.
A quantum dot-polymer composite film using the quantum dot is produced and conversion efficiency is measured. The results are shown in Table 5.
An ICP-AES analysis of the produced quantum dot is performed and the results are shown in Table 6.

Example 3

1. A red light emitting quantum dot including a titanium dopant is obtained according to the same manner as Example 1 except that the core of Reference Example 2 is used instead of the core of Reference Example 1 and 0.1 mmol of titanium isopropoxide is used.
2. A photoluminescence analysis of the produced quantum dot is performed using excited light of 450 nm. The results are shown in Table 4.
A quantum dot-polymer composite film using the quantum dot is produced and conversion efficiency is measured. The results are shown in Table 5.
From the results of ICP-AES analysis of the produced quantum dot, it is confirmed that a mole ratio (Ti/In) of titanium relative to indium is 1.019.

Example 4

1. A red light emitting quantum dot including a zirconium dopant is obtained according to the same manner as Example 1 except that the core of Reference Example 2 is used instead of the core of Reference Example 1 and 0.2 mmol of zirconium isopropoxide is used.
2. A photoluminescence analysis of the produced quantum dot is performed using excited light of 450 nm. The results are shown in Table 4.
A quantum dot-polymer composite film using the quantum dot is produced and conversion efficiency is measured. The results are shown in Table 5.
From the results of ICP-AES analysis of the produced quantum dot, it is confirmed that a mole ratio (Zr/In) of zirconium relative to indium is 0.063.

Comparative Example 2

1. A red light emitting quantum dot including a titanium dopant is obtained according to the same manner as Example 1 except that the core of Reference Example 2 is used instead of the core of Reference Example 1 and hafnium isopropoxide is not added.

2. A photoluminescence analysis of the produced quantum dot is performed using excited light of 450 nm. The results are shown in Table 4.
A quantum dot-polymer composite film using the quantum dot is produced and conversion efficiency is measured. The results are shown in Table 5.
An ICP-AES analysis of the produced quantum dot is performed and the results are shown in Table 6.

TABLE 4

| | UV first absorption (nm) | Photoluminescence wavelength (nm) | Full width at half maximum (FWHM) (nm) | QY (%) |
|---|---|---|---|---|
| Example 2 | 592 | 617 | 40 | 93 |
| Example 3 | 593 | 616 | 40 | 89 |
| Example 4 | 597 | 621 | 39 | 91 |
| Comparative Example 2 | 596 | 620 | 39 | 86 |

TABLE 5

| | CE after POB (%) | Process maintenance rate |
|---|---|---|
| Example 2 | 32% | 81% |
| Example 3 | 35% | 79% |
| Example 4 | 32% | 90% |
| Comparative Example 2 | 29.7% | 77% |

TABLE 6

| | Mole ratio (X/In) | | | | | |
|---|---|---|---|---|---|---|
| Samples | P/In | S/In | Zn/In | Se/In | In/In | Hf/In |
| Comparative Example 2 | 0.778 | 4.800 | 11.044 | 4.578 | 1.000 | 0 |
| Example 2 | 0.318 | 4.909 | 11.886 | 4.591 | 1.000 | 0.045 |

Comparative Example 3

1. A green light emitting quantum dot including a sodium dopant is obtained according to the same manner as Example 1 except that 0.04 mmol of silver acetate is used instead of hafnium isopropoxide. [2] A photoluminescence analysis of the produced quantum dot is performed using excited light of 450 nm. The results are shown in Table 7.

Comparative Example 4

1. A green light emitting quantum dot including a sodium dopant is obtained according to the same manner as Example 1 except that 0.04 mmol of copper acetate is used instead of hafnium isopropoxide.
2. A photoluminescence analysis of the produced quantum dot is performed using excited light of 450 nm. The results are shown in Table 7.

TABLE 7

|  | PL | FWHM | QY difference relative to non-doped QD |
|---|---|---|---|
| Comparative Example 3 | — | — | No photoluminescence |
| Comparative Example 4 | — | — | No photoluminescence |

From the results of Table 7, doping of the noble metal does not exhibit increase of luminous efficiency and in case of a part of metals, photoluminescence does not appear.

Comparative Example 5

1. A red light emitting quantum dot including a europium dopant is obtained according to the same manner as Example 2 except that 0.2 mmol of europium acetate is used instead of hafnium isopropoxide.
2. A photoluminescence analysis of the produced quantum dot is performed using excited light of 450 nm and the results are shown in Table 8.

TABLE 8

|  | PL | FWHM | QY difference relative to non-doped QD |
|---|---|---|---|
| Comparative Example 5 | 628 | 38 | −3 |

From the results of Table 8, doping of a part of lanthanum-based metal does not exhibit actual increases of luminous efficiency or exhibits decreases of luminous efficiency.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot, comprising
a core comprising a first semiconductor nanocrystal; and
a shell disposed on the core, the shell comprising a second semiconductor nanocrystal and a metal dopant,
wherein the first semiconductor nanocrystal comprises a Group II-VI compound, a Group III-V compound, or a combination thereof,
the second semiconductor nanocrystal comprises a Group II-VI compound,
the metal dopant comprises hafnium, zirconium, titanium, or a combination thereof,
wherein the shell has a varying composition in a radial direction, and
wherein the shell comprises sulfur and an amount of the sulfur increases in a radial direction toward a surface of the quantum dot.

2. The quantum dot of claim 1, wherein the first semiconductor nanocrystal comprises a Group III-V compound.

3. The quantum dot of claim 2, wherein the Group III-V compound comprises InP, InZnP, InAs, InSb, or a combination thereof.

4. The quantum dot of claim 1, wherein the core does not include Ti, Zr, Hf, V, Nb, Ta, Cr, Mo, W, Mn, Tc, Re, Fe, Ru, Os, Co, Rh, Ir, Ni, Pd, Pt, Cu, Ag, Au, Li, Na, K, Rb, Cs, Fr, or a combination thereof.

5. The quantum dot of claim 1, wherein the shell does not comprise a trivalent cation of a Group IIIA element.

6. The quantum dot of claim 1, wherein the second semiconductor nanocrystal comprises zinc, sulfur, selenium, and optionally tellurium.

7. A quantum dot, comprising
a core comprising a first semiconductor nanocrystal; and
a shell disposed on the core, the shell comprising a second semiconductor nanocrystal and a metal dopant,
wherein the first semiconductor nanocrystal comprises a Group II-VI compound, a Group III-V compound, or a combination thereof,
the second semiconductor nanocrystal comprises a Group II-VI compound,
the metal dopant comprises hafnium, zirconium, titanium, or a combination thereof, and
wherein the shell comprises a non-metal dopant.

8. The quantum dot of claim 7, wherein the non-metal dopant does not comprise fluorine.

9. A quantum dot, comprising
a core comprising a first semiconductor nanocrystal; and
a shell disposed on the core, the shell comprising a second semiconductor nanocrystal and a metal dopant,
wherein the first semiconductor nanocrystal comprises a Group II-VI compound, a Group III-V compound, or a combination thereof,
the second semiconductor nanocrystal comprises a Group II-VI compound,
the metal dopant comprises hafnium, zirconium, titanium, or a combination thereof, and
wherein the shell does not comprise phosphorus.

10. The quantum dot of claim 1, wherein the shell does not comprise aluminum.

11. The quantum dot of claim 10, wherein the quantum dot does not comprise cadmium.

12. The quantum dot of claim 1, wherein the shell comprises at least two layers and adjacent layers comprise semiconductor nanocrystals having different compositions.

13. The quantum dot of claim 11, wherein the outermost layer of the shell comprises ZnS.

14. The quantum dot of claim 13, wherein the outermost layer of the shell comprises the metal dopant.

15. The quantum dot of claim 1, wherein an amount of the metal dopant is greater than or equal to about 0.001 moles, based on 1 mole of a base metal of the first semiconductor nanocrystal.

16. The quantum dot of claim 1, wherein an amount of the metal dopant is less about than 0.1 weight percent, based on a total atomic weight of the quantum dot.

17. The quantum dot of claim 1, wherein the quantum dot has a full width at half maximum of less than or equal to about 40 nanometers and a quantum yield of greater than or equal to about 72%.

18. A method of producing a quantum dot, wherein the quantum dot comprises a core comprising a first semiconductor nanocrystal; and
a shell disposed on the core, the shell comprising a second semiconductor nanocrystal and a metal dopant,
wherein the first semiconductor nanocrystal comprises a Group II-VI compound, a Group III-V compound, or a combination thereof,
the second semiconductor nanocrystal comprises a Group II-VI compound,
the metal dopant comprises hafnium, zirconium, titanium, or a combination thereof, and wherein the method comprises
preparing a mixture comprising a particle comprising the core comprising the first semiconductor nanocrystal, a shell metal precursor, a shell non-metal precursor, an organic ligand, a solvent, and a metal dopant precursor; and
heating the mixture to a reaction temperature to form the shell comprising the metal dopant and the second semiconductor nanocrystal on the particle to produce the quantum dot,
wherein the metal dopant precursor comprises hafnium, zirconium, titanium, or a combination thereof.

19. The method of claim 18, wherein the preparing of the mixture comprises forming a shell layer directly on the core, the shell layer having a different composition from the second semiconductor nanocrystal, the shell layer comprising a third semiconductor nanocrystal that does not comprise the metal dopant.

20. The method of claim 18, wherein the dopant precursor comprises an oleate, a stearate, a chloride, an octanoate, an acetate, an alkoxide, a palmitate, an isopropoxide, a propoxide, or a combination thereof.

21. A quantum dot-polymer composite comprising
a polymer matrix; and
a plurality of quantum dots comprising the quantum dot of claim 1 dispersed in the polymer matrix.

22. The quantum dot-polymer composite of claim 21, wherein the polymer matrix comprises a cross-linked polymer, a carboxylic acid-containing binder polymer, or a combination thereof.

23. The quantum dot-polymer composite of claim 22, wherein the cross-linked polymer comprises a thiolene resin, a cross-linked poly(meth)acrylate, a cross-linked polyurethane, a cross-linked epoxy resin, a cross-linked vinyl polymer, a cross-linked silicone resin, or a combination thereof.

24. A photoluminescence display device comprising the quantum dot polymer composite of claim 21.

25. The photoluminescence display device of claim 24, wherein the display device further comprises a light source to supply incident light to the quantum dot polymer composite.

26. The photoluminescence display device of claim 24, further comprising a patterned layer on a substrate, the patterned layer comprising a first section configured to emit a first light and a second section configured to emit a second light having a different wavelength from the first light, and
wherein at least one of the first section and the second section comprises the quantum dot-polymer composite.

27. An electric field light emitting device, comprising
a first electrode and a second electrode facing each other; and
a quantum dot emission layer disposed between the first electrode and the second electrode, the quantum dot emission layer comprising a plurality of quantum dots,
wherein the plurality of quantum dots comprises the quantum dot of claim 1.

28. The quantum dot of claim 9, wherein the core does not comprise chromium and the quantum dot does not comprise cadmium.

* * * * *